(12) United States Patent
Kim et al.

(10) Patent No.: US 10,271,429 B2
(45) Date of Patent: Apr. 23, 2019

(54) DISPLAY DEVICE AND METHOD FOR MANUFACTURING THE SAME

(71) Applicant: SAMSUNG DISPLAY CO., LTD., Yongin-si, Gyeonggi-do (KR)

(72) Inventors: Byoung Yong Kim, Seoul (KR); Jeong Ho Hwang, Cheonan-si (KR); Jong Hyuk Lee, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/641,686

(22) Filed: Jul. 5, 2017

(65) Prior Publication Data

US 2018/0014405 A1    Jan. 11, 2018

(30) Foreign Application Priority Data

Jul. 8, 2016   (KR) ........................ 10-2016-0086944

(51) Int. Cl.
| | |
|---|---|
| *H05K 7/10* | (2006.01) |
| *H05K 7/12* | (2006.01) |
| *H05K 1/11* | (2006.01) |
| *H01L 23/00* | (2006.01) |
| *H05K 1/18* | (2006.01) |

(52) U.S. Cl.
CPC ............. *H05K 1/111* (2013.01); *H01L 24/06* (2013.01); *H01L 24/16* (2013.01); *H01L 24/29* (2013.01); *H01L 24/32* (2013.01); *H01L 24/73* (2013.01); *H05K 1/181* (2013.01); *H01L 2224/06135* (2013.01); *H01L 2224/06153* (2013.01); *H01L 2224/06155* (2013.01); *H01L 2224/06177* (2013.01); *H01L 2224/16227* (2013.01); *H01L 2224/29499* (2013.01); *H01L 2224/32227* (2013.01); *H01L 2224/73204* (2013.01); *H01L 2224/81193* (2013.01); *H01L 2224/81194* (2013.01); *H05K 2201/09227* (2013.01)

(58) Field of Classification Search
CPC . H01L 2224/06135; H01L 2224/06153; H01L 2224/06155; H01L 2224/06177; H01L 2224/16227; H01L 2224/29499; H01L 2224/32227; H01L 2224/73204; H01L 2224/81193; H01L 2224/81194; H01L 24/06
See application file for complete search history.

(56) References Cited

U.S. PATENT DOCUMENTS

| | | | | |
|---|---|---|---|---|
| 5,777,855 A | * | 7/1998 | Yokajty | H01R 12/62 361/749 |
| 5,951,304 A | * | 9/1999 | Wildes | B81B 7/0006 174/261 |
| 9,974,175 B2 | * | 5/2018 | Bae | H01L 24/06 |

(Continued)

FOREIGN PATENT DOCUMENTS

| | | |
|---|---|---|
| KR | 10-0701895 | 3/2007 |
| KR | 10-20080061602 | 7/2008 |

*Primary Examiner* — Yuriy Semenenko
(74) *Attorney, Agent, or Firm* — F. Chau & Associates, LLC

(57) ABSTRACT

A display device includes a display substrate including a display area where an image is displayed and a pad area disposed at a periphery of the display area, and a first pad portion disposed in the pad area, the first pad portion including a plurality of first line pad terminals arranged along a first curved line in a first direction.

19 Claims, 26 Drawing Sheets

(56) References Cited

U.S. PATENT DOCUMENTS

| | | | |
|---|---|---|---|
| 2005/0094382 A1* | 5/2005 | Lassar | H05K 1/111 |
| | | | 361/767 |
| 2006/0049494 A1* | 3/2006 | Urushido | H01L 23/49838 |
| | | | 257/666 |
| 2012/0134120 A1* | 5/2012 | Gondo | G02F 1/13452 |
| | | | 361/748 |
| 2014/0138638 A1* | 5/2014 | Bae | H01L 51/5253 |
| | | | 257/40 |
| 2014/0321088 A1* | 10/2014 | Bae | H05K 1/117 |
| | | | 361/767 |
| 2016/0066409 A1 | 3/2016 | Kwon et al. | |
| 2017/0135216 A1* | 5/2017 | Cho | H05K 1/189 |

* cited by examiner

FIG. 26
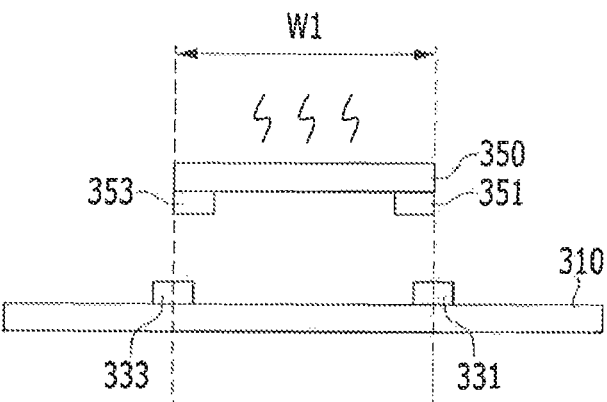
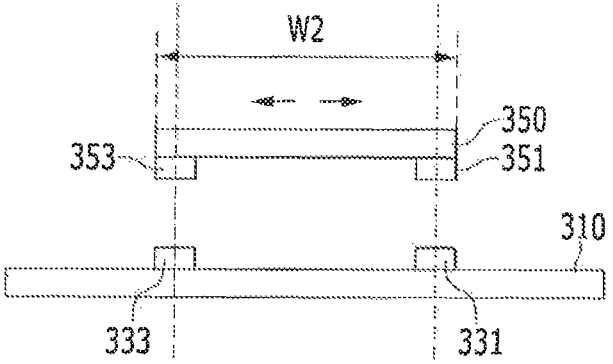
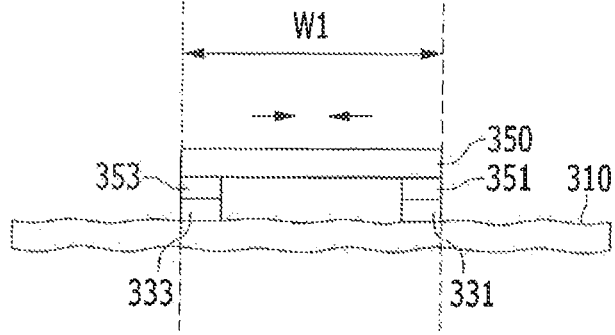

DISPLAY DEVICE AND METHOD FOR MANUFACTURING THE SAME

CROSS-REFERENCE TO RELATED APPLICATION

This application claims priority under 35 U.S.C. § 119 to Korean Patent Application No. 10-2016-0086944, filed on Jul. 8, 2016, in the Korean Intellectual Property Office, the disclosure of which is incorporated by reference herein in its entirety.

TECHNICAL FIELD

The present invention relates to a display device and a method for manufacturing the same.

DISCUSSION OF THE RELATED ART

Display devices include liquid crystal display (LCD) devices, plasma display panel (PDP) devices, organic light emitting diode (OLED) devices, field effect display (FED) devices, electrophoretic display devices, and the like.

An OLED display device includes a plurality of OLED elements. An OLED element includes two electrodes and an organic emission layer disposed between the two electrodes. The OLED display device emits light when an electron, injected from one electrode of an OLED element, and a hole, injected from the other electrode of the OLED element, are coupled with each other in the organic emission layer to form an exciton. The exciton discharges energy in the form of light.

Since the OLED display device has a self-luminance characteristic and does not require a separate light source, the OLED device may be manufactured to be thin and light. Further, an OLED device features low power consumption, a high luminance, and a high response speed.

A printed circuit board may be used for transmitting driving signals which drive the OLED elements of the OLED device.

The printed circuit board may be electrically connected to the OLED elements through a plurality of terminals to effectuate transmission of the driving signals.

SUMMARY

According to an exemplary embodiment of the present invention, in a display device which includes a printed circuit board, the printed circuit board having a first set of pad terminals, and a display substrate, the display substrate having a second set of terminals in contact with the first set of terminals, the first and second set of terminals may not be misaligned.

According to an exemplary embodiment of the present invention, a method for manufacturing a display device may be used to prevent misalignment between pad terminals of a printed circuit board and pad terminals of a display substrate.

According to an exemplary embodiment of the present invention, a display device includes a display substrate including a display area where an image is displayed and a pad area disposed at a periphery of the display area, and a first pad portion disposed in the pad area, the first pad portion including a plurality of first line pad terminals arranged along a first curved line in a first direction.

According to an exemplary embodiment of the present invention, a method for manufacturing a display device includes receiving a display substrate, the display substrate including a display area for displaying an image and a pad area including a first pad portion, wherein a plurality of first line pad terminals are formed in the first pad portion, wherein the plurality of first line pad terminals are arranged along a first line, the first line extending in a first direction, receiving a printed circuit board, the printed circuit board including a base film and a second pad portion disposed at a first side of the base film, wherein a plurality of second line pad terminals are formed in the second pad portion, wherein the plurality of second line pad terminals are arranged along a second line, the second line extending in the first direction, and wherein a driving chip is disposed at a second side of the base film, and coupling the display substrate with the printed circuit board such that the plurality of first line pad terminals and the plurality of second line pad terminals are overlapped with each other.

According to an exemplary embodiment of the present invention, a display device includes a display substrate including a display area where an image is displayed and a pad area disposed at a periphery of the display area, and a first pad portion disposed in the pad area, the first pad portion including a plurality of first line pad terminals arranged along a line in a first direction.

BRIEF DESCRIPTION OF THE DRAWINGS

The above and other features of the present invention will become more apparent by describing in detail exemplary embodiments thereof with reference to the accompanying drawings, in which:

FIG. 26 is a side view illustrating a process in which the driving chip is attached to the base film of the printed circuit board, according to an exemplary embodiment of the present invention.

DETAILED DESCRIPTION OF THE EMBODIMENTS

Figure 1:
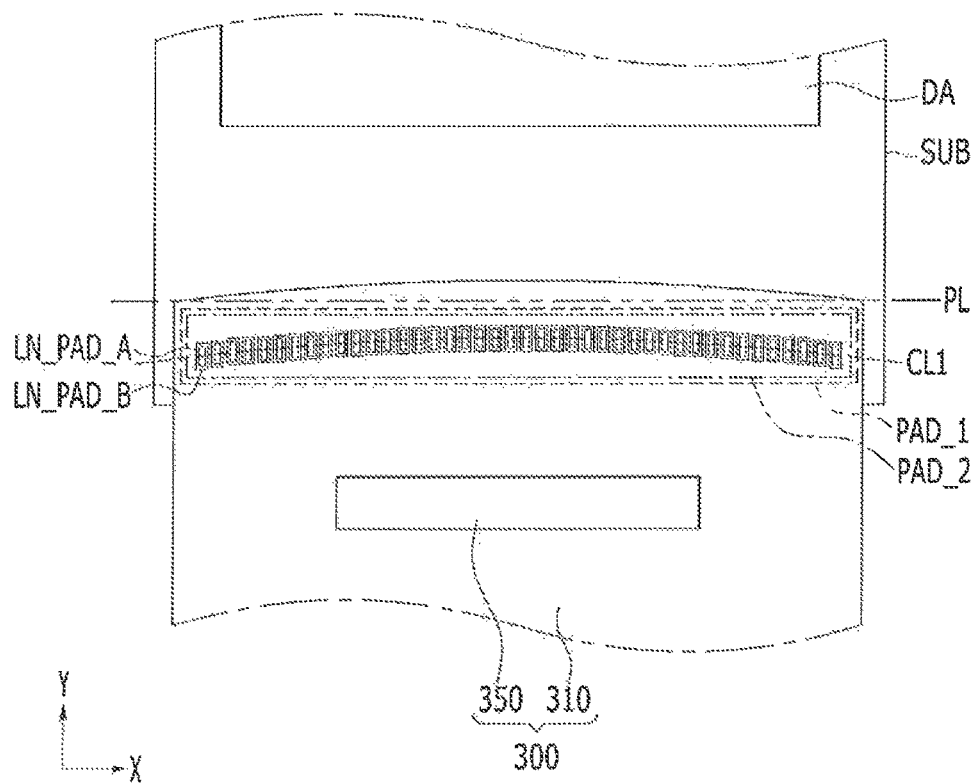
FIG. 1 is a plan view illustrating a display device, according to an exemplary embodiment of the present invention.

Hereinafter, exemplary embodiments of the present invention will be described in detail with reference to the accompanying drawings. The disclosed exemplary embodiments may be modified in different ways without departing from the spirit and scope of the present invention. Like reference numerals may refer to like elements throughout the specification.

In addition, the size and thickness of each element shown in the drawings may be exaggerated for clarity.

It will be understood that when an element such as a layer, film, region, or substrate is referred to as being "on" another element, it can be directly on the other element or intervening elements may also be present therebetween.

Hereinafter, a display device according to an exemplary embodiment of the present invention will be described with reference to FIG. 1 to FIG. 4.

Figure 2:
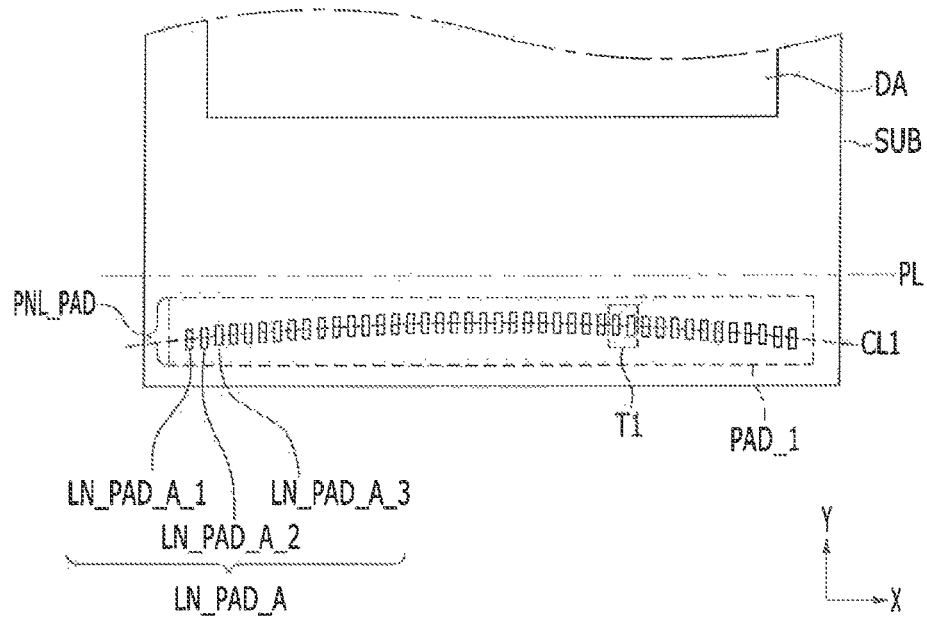
FIG. 2 is a plan view illustrating a display substrate of FIG. 1, according to an exemplary embodiment of the present invention.
Figure 3:
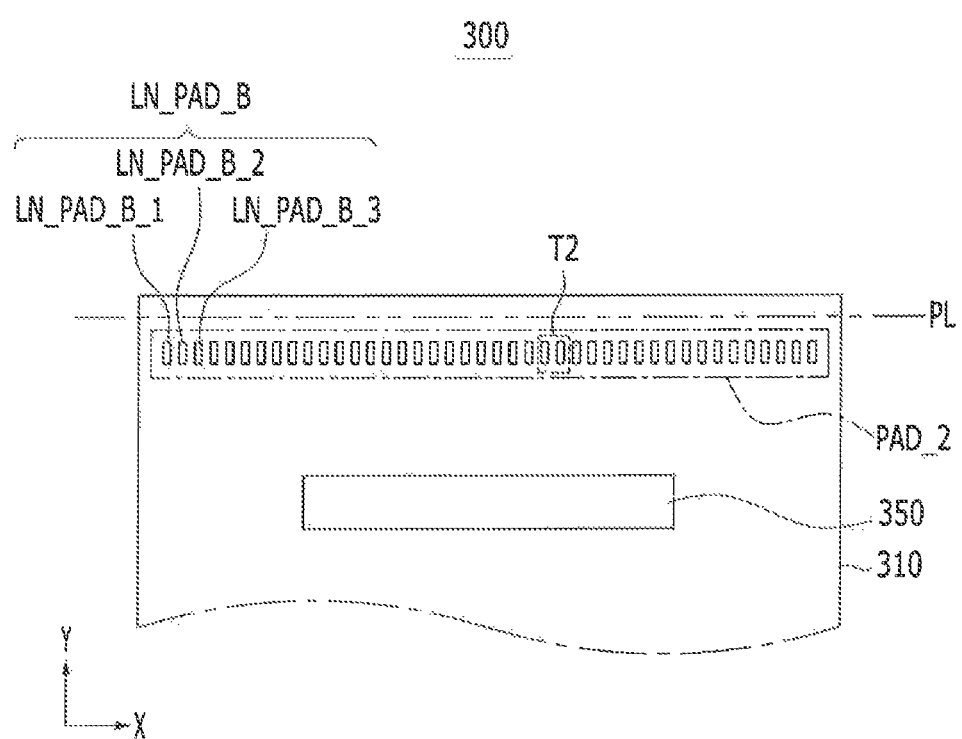
FIG. 3 is a plan view illustrating a printed circuit board before being attached to the display substrate of FIG. 1, according to an exemplary embodiment of the present invention.
Figure 4:
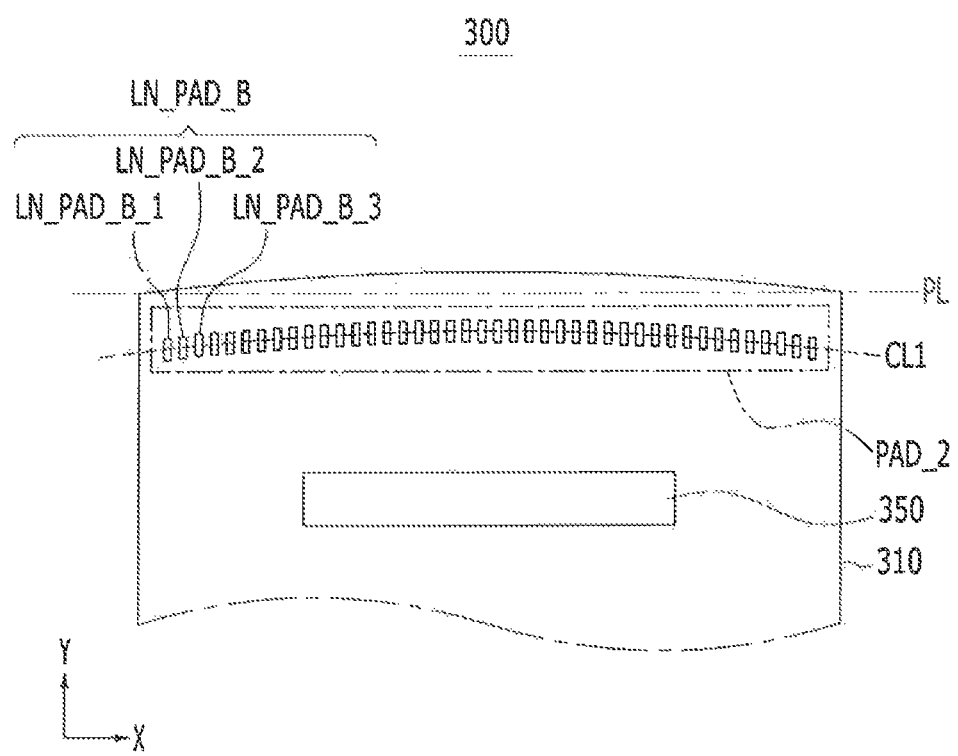
FIG. 4 is a plan view illustrating the printed circuit board of FIG. 3 after being attached to the display substrate of FIG. 1, according to an exemplary embodiment of the present invention.

FIG. 1 is a plan view illustrating a display device, according to an exemplary embodiment of the present invention. FIG. 2 is a plan view illustrating a display substrate of FIG. 1, according to an exemplary embodiment of the present invention. FIG. 3 is a plan view illustrating a printed circuit board before being attached to the display substrate of FIG. 1, according to an exemplary embodiment of the present invention. FIG. 4 is a plan view illustrating the printed circuit board of FIG. 3 after being attached to the display substrate of FIG. 1, according to an exemplary embodiment of the present invention.

Referring to FIG. 1 to FIG. 4, a display device may include a display substrate SUB, a first pad portion PAD_1, a second pad portion PAD_2, and a printed circuit board 300. In an exemplary embodiment of the present invention, first line pad terminals LN_PDA_A are disposed in the first pad portion PAD_1 of the display substrate SUB, and second line pad terminals LN_PAD_B are disposed in the second pad portion PAD_2 of a base film 310. The printed circuit board 300 may include the base film 310 and a driving chip 350 disposed on the base film 310. The first line pad terminals LN_PAD_A and the second line pad terminals LN_PAD_B are aligned along a first curved line CL1, which has a curved shape. The first line pad terminals LN_PAD_A and the second line pad terminals LN_PAD_B may be overlapped with each other. In addition, the center of each of the first line pad terminals LN_PAD_A and the center of each of the second line pad terminals LN_PAD_B may be disposed on the first curved line CL1.

Referring to FIG. 2, the display substrate SUB may include a display area DA and a pad area PNL_PAD. The display area DA and the pad area PNL_PAD indicate areas of the display substrate SUB.

The display area DA is an area where an image is displayed, and a display panel that emits light may be disposed in the display area DA. The display panel includes a plurality of pixels that emit light. The plurality of pixels may be organic light emitting elements, liquid crystal display elements, electrophoretic display elements, and the like.

The pad area PNL_PAD is an area that is disposed at the periphery of the display area DA, and the pad area PNL_PAD may be connected with the printed circuit board 300 (refer to FIG. 1). The printed circuit board 300 transmits signals for driving the plurality of pixels. The first pad portion PAD_1 is disposed in the pad area PNL_PAD such that the first pad portion PAD_1 and the second pad portion PAD_2 (refer to FIG. 1) of the printed circuit board 300 may be electrically connected to each other.

The plurality of first line pad terminals LN_PAD_A may be disposed in the first pad portion PAD_1. The plurality of first line pad terminals LN_PAD_A may be electrically connected with the second line pad terminals LN_PAD_B of the printed circuit board 300. The plurality of first line pad terminals LN_PAD_A and the second line pad terminals LN_PAD_B overlap each other, and a conductive adhesive film 500 (refer to FIG. 16) is disposed between the overlapped first and second line pad terminals LN_PAD_A and LN_PAD_B to electrically connect the first and second line pad terminals LN_PAD_A and LN_PAD_B. Thus, signals for driving the display panel may be transmitted to the display panel through the second line pad terminals LN_PAD_B and the first line pad terminals LN_PAD_A.

The plurality of first line pad terminals LN_PAD_A may be aligned along the first curved line CL1. For example, the first line pad terminals LN_PAD_A_1, LN_PAD_A_2, and LN_PAD_A_3 may be aligned in a first direction along the first curved line CL1. Hereinafter, the X-axis will indicate the first direction and the Y-axis will indicate a second direction crossing the first direction.

In an exemplary embodiment of the present invention, the first curved line CL1 may have a curved shape. For example, the first curved line CL1 may be a curved line of which a center area is convex. In this case, the first curved line CL1 may be convexly curved toward the display area DA in the pad area PNL_PAD. In addition, sides of the first curved line CL1 may be symmetrical to each other with respect to the center of the first curved line CL1.

Every pair of first line pad terminals LN_PAD_A that are adjacent to each other, among the plurality of first line pad terminals LN_PAD_A, may have the same gap therebetween. For example, the plurality of first line pad terminals LN_PAD_A may be arranged with a constant interval along the first curved line CL1. However, the present invention is not limited thereto, and some of the plurality of first line pad terminals LN_PAD_A may be arranged with an interval that is different from the interval of others.

Referring to FIG. 3, the printed circuit board 300 may include the base film 310, the second pad portion PAD_2, and the driving chip 350.

The second pad portion PAD_2 may be disposed at an end of the base film 310. The base film 310 may be flexible. As described above, when the printed circuit board 300 is attached to the pad area PNL_PAD of the display substrate SUB, the second pad portion PAD_2 and the first pad portion PAD_1 may be electrically connected to each other.

A plurality of second line pad terminals LN_PAD_B may be disposed in the second pad portion PAD_2. When the printed circuit board 300 is attached to the pad area PNL_PAD of the display substrate SUB, the plurality of second line pad terminals LN_PAD_B may be overlapped with the plurality of first line pad terminals LN_PAD_A.

The plurality of second line pad terminals LN_PAD_B may be aligned along a reference line PL, which is a straight line. For example, the second line pad terminals LN_PAD_B_1, LN_PAD_B_2, and LN_PAD_B_3 may be aligned in a straight line in the first direction, and the straight line may be parallel with the reference line PL.

FIG. 3 shows the printed circuit board 300 before being attached to the display substrate SUB, and the plurality of second line pad terminals LN_PAD_B may be straightly aligned before the printed circuit board 300 is attached to the display substrate SUB.

For example, before the printed circuit board 300 is attached to the display substrate SUB, as shown in FIG. 3, the second line pad terminals LN_PAD_B may be aligned in a format that is different from that of the first line pad terminals LN_PAD_A. The plurality of first line pad terminals LN_PAD_A of FIG. 2 are aligned along the first curved line CL1, but the plurality of second line pad terminals LN_PAD_B of FIG. 3 are aligned in a straight line.

Referring to FIG. 3, in a plan view, the plurality of second line pad terminals LN_PAD_B are aligned in a straight line along the first direction (X-axis), but the periphery of the second pad portion PAD_2 of the base film 310 may be waved or wrinkled in a direction that is perpendicular to the X-Y plane. The base film 310 may be repeatedly expanded and contracted due to heat while the driving chip 350 is attached to the base film 310. The repetitive expansion and contraction of the base film 310 may cause the periphery of the second pad portion PAD_2 of the base film 310 to be waved or wrinkled.

Referring to FIG. 4, when the printed circuit board 300 is coupled to the display substrate SUB, the plurality of second line pad terminals LN_PAD_B, disposed in the printed circuit board 300, may be arranged along the first curved line CL1. For example, when the printed circuit board 300 is attached to the display substrate SUB, the arrangement format of the second line pad terminals LN_PAD_B may be changed.

For example, when the second pad portion PAD_2 of a wave-shaped base film 310 is air-tightly attached to the pad area PNL_PAD of the display substrate SUB, a portion of the base film 310 corresponding to the second pad portion PAD_2 is deformed to be flat to be attached to the display substrate SUB. When the wave-shaped base film 310 is changed to the flat-shaped base film 310, as shown in FIG. 4, a center area of an upper edge of the base film 310 may be shaped to be convex. Accordingly, the arrangement of the plurality of second line pad terminals LN_PAD_B, disposed in the second pad portion PAD_2 of the base film 310, may be deformed to be convex along the first curved line CL1. For example, the arrangement format of the second line pad terminals LN_PAD_B may be changed to the curved line format from the straight line format.

Hereinafter, a process of the change of the arrangement format of the second line pad terminals LN_PAD_B, caused when the printed circuit board 300 is attached to the display substrate SUB, will be described with reference to FIG. 26.

FIG. 26 is a side view illustrating a process in which the driving chip is attached to the base film of the printed circuit board, according to an exemplary embodiment of the present invention.

As shown in FIG. 26 (A), the driving chip 350 is heated before being attached to the base film 310. In this case, the driving chip 350 may be heated at a temperature of about 460° C. to about 500° C.

When the driving chip 350 is heated, as shown in FIG. 26 (B), a first width W1 of the driving chip 350 is increased to a second width W2. Thus, a distance between first pins 351 and 353 of the driving chip 350 become equal to a distance between second pins 331 and 333 of the base film 310. Then, the first pins 351 and 353 and the second pins 331 and 333 are arranged to face each other and are then coupled to each other (e.g., connected to each other).

As shown in FIG. 26 (C), when the driving chip 350 is cooled after being coupled to the base film 310, the width of the driving chip 350 is reduced from the width W2 to the width W1. When the width of the driving chip 350 is reduced to the width W1, the distance between the second pins 331 and 333 is also reduced. Thus, the surface of the base film 310 where the second pins 331 and 333 are fixed may be deformed to have a wave shape.

Referring to FIG. 3, the periphery of the second pad portion PAD_2 of the base film 310 may also have the above-stated wave shape. As shown in FIG. 4, when the second pad portion PAD_2 is air-tightly attached to the pad area PNL_PAD of the display substrate SUB, the second line pad terminals LN_PAD_B of the second pad portion PAD_2 are arranged along the curved line format from the straight line format.

As described, in an exemplary embodiment of the present invention, the first line pad terminals LN_PAD_A, disposed in the first pad portion PAD_1 of the display substrate SUB, are arranged along the first curved line CL1 in consideration of the deformation of the base film 310 of the printed circuit board 300. The deformation of the base film 310 occurs when the printed circuit board 300 is attached to the display substrate SUB. For example, the plurality of first line pad terminals LN_PAD_A can be arranged along the first curved line CL1 so that the first line pad terminals LN_PAD_A may be precisely overlapped with the second line pad terminals LN_PAD_B.

Thus, according to an exemplary embodiment of the present invention, occurrence of misalignment between the first line pad terminals LN_PAD_A and the second line pad terminals LN_PAD_B, during attachment of the printed circuit board 300 to the display substrate SUB, can be prevented.

Hereinafter, a detailed structure of the plurality of first line pad terminals LN_PAD_A of FIG. 2 will be described with reference to FIG. 5 to FIG. 8.

Figure 5:
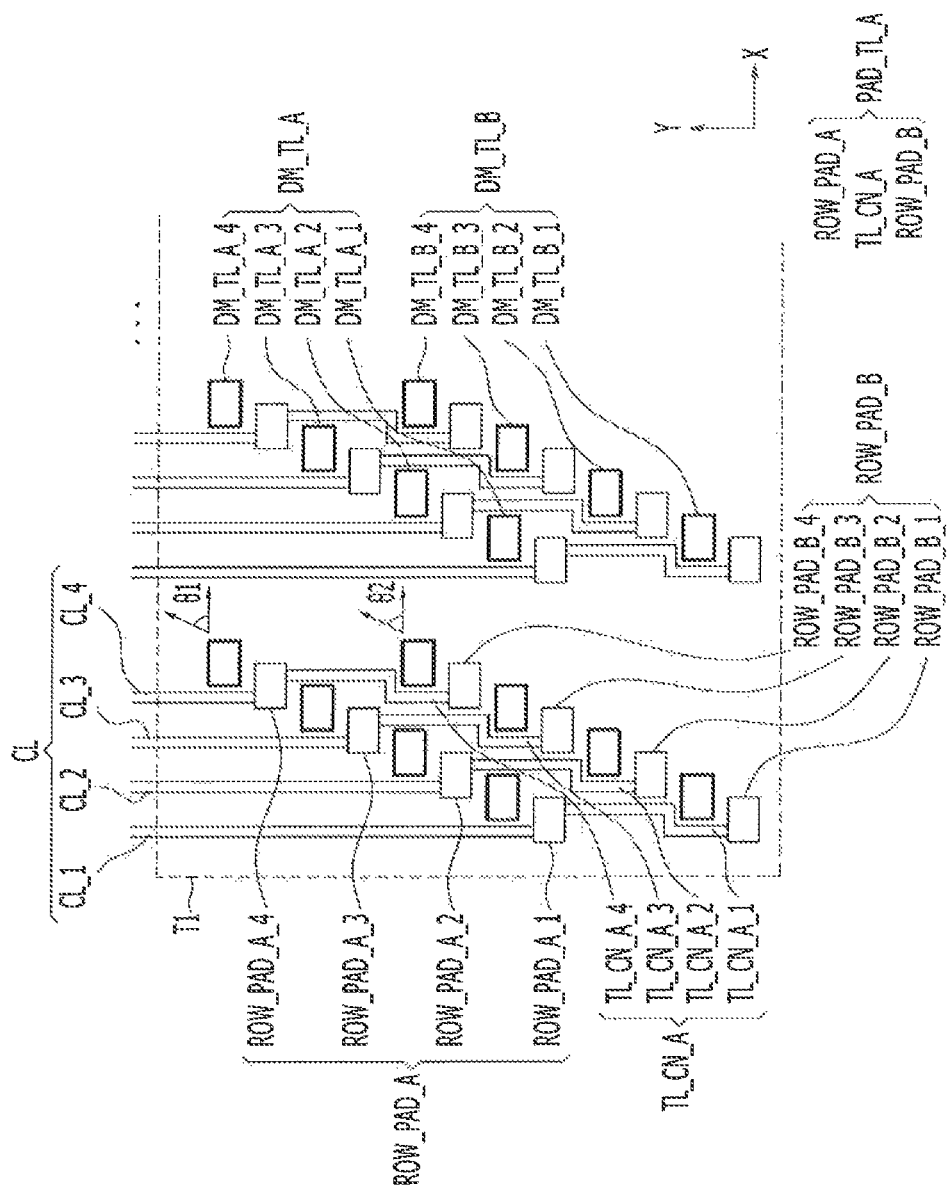
FIG. 5 is an enlarged plan view of an area T1 of FIG. 2, according to an exemplary embodiment of the present invention.
Figure 6:
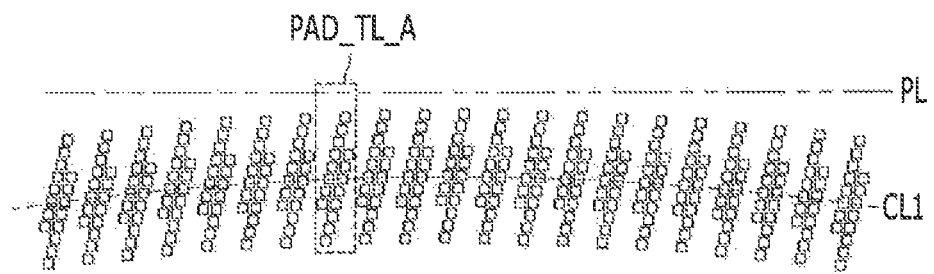
FIG. 6 is a plan view illustrating an arrangement of the first pad terminals in the first pad portion of FIG. 2, according to an exemplary embodiment of the present invention.
Figure 7:
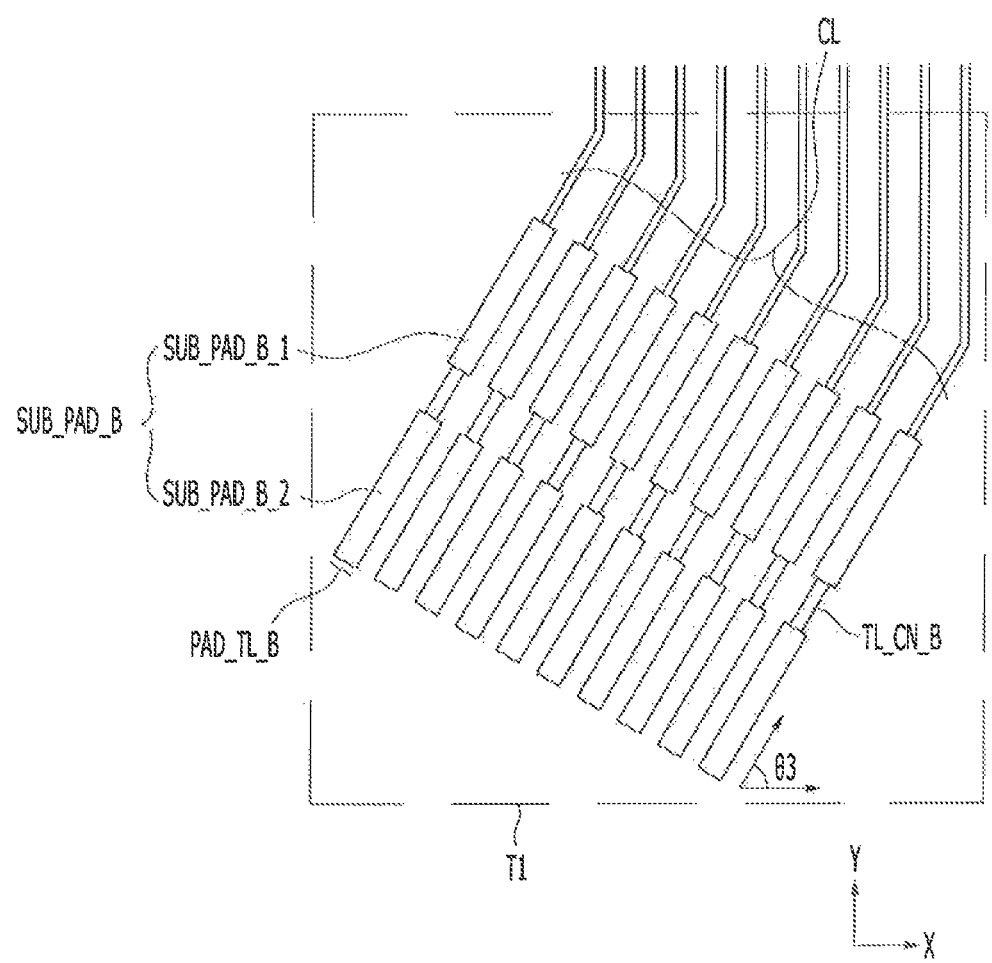
FIG. 7 is an enlarged plan view illustrating second pad terminals of the area T1 of FIG. 2, according to an exemplary embodiment of the present invention.
Figure 8:
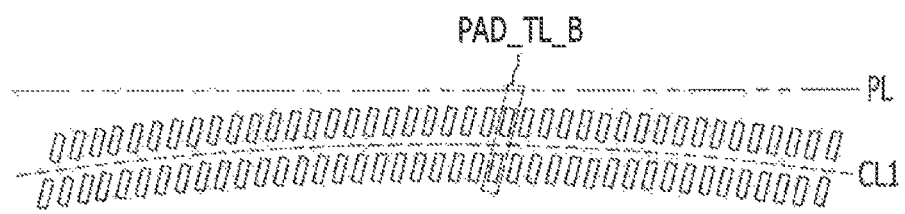
FIG. 8 is an enlarged plan view illustrating the second pad terminals of the first pad portion of FIG. 2, according to an exemplary embodiment of the present invention.

FIG. 5 is an enlarged plan view of an area T1 of FIG. 2, according to an exemplary embodiment of the present invention. FIG. 6 is a plan view illustrating an arrangement of the first pad terminals LN_PAD_A in the first pad portion PAD_1 of FIG. 2, according to an exemplary embodiment of the present invention. FIG. 7 is an enlarged plan view illustrating second pad terminals of the area T1 of FIG. 2, according to an exemplary embodiment of the present invention. FIG. 8 is an enlarged plan view illustrating second pad terminals of the first pad portion PAD_1 of FIG. 2, according to an exemplary embodiment of the present invention.

Referring to FIG. 5 and FIG. 6, the first line pad terminals LN_PAD_A, disposed in the first pad portion PAD_1, may respectively include first pad terminals PAD_TL_A. For example, a single first line pad terminal LN_PAD_A of FIG. 2 (e.g., the first pad terminal PAD_TL_A_1) may be a first pad terminal PAD_TL_A. Thus, as shown in FIG. 6, the first pad terminals PAD_TL_A of FIG. 5 may be arranged along the first curved line CL1 in an exemplary embodiment of the present invention. Each of the plurality of first pad terminals PAD_TL_A may include first row sub-pad terminals ROW_PAD_A, second row sub-pad terminals ROW_PAD_B, and first terminal connection lines TL_CN_A.

In an exemplary embodiment of the present invention, the first row sub-pad terminals ROW_PAD_A may be spaced apart from each other along a certain direction. The certain direction, in which the first row sub-pad terminals ROW_PAD_A are arranged, may form a first inclination angle θ1 with respect to the first direction. The first inclination angle θ1 may be between 0 degrees and 90 degrees, exclusive of 0 degrees and 90 degrees.

Distances between adjacent first row sub-pad terminals ROW_PAD_A may be equal to each other. For example, a distance between the first row sub-pad terminal ROW_PAD_A_1 and the first row sub-pad terminal ROW_PAD_A_2, a distance between the first row sub-pad terminal ROW_PAD_A_2 and the first row sub-pad terminal ROW_PAD_A_3, and a distance between the first row sub-pad terminal ROW_PAD_A_3 and the first row sub-pad terminal ROW_PAD_A_4 may be equal to each other.

The first row sub-pad terminals ROW_PAD_A electrically contact third row sub-pad terminals ROW_PAD_C. The first row sub-pad terminals ROW_PAD_A may have a quadrangular shape. However, the first row sub-pad terminals ROW_PAD_A may also have a polygonal or curved shape.

The second row sub-pad terminals ROW_PAD_B may be disposed at a distance from the first row sub-pad terminals ROW_PAD_A in the second direction. The second row sub-pad terminals ROW_PAD_B may be spaced apart from each other along a certain direction.

The certain direction, in which the second row sub-pad terminals ROW_PAD_B are arranged, may form a second inclination angle θ2 with respect to the first direction. The second inclination angle θ2 may be between 0 degrees and 90 degrees, exclusive of 0 degrees and 90 degrees.

In an exemplary embodiment of the present invention, the first inclination angle θ1 and the second inclination angle θ2 may be equal to each other. Thus, the first row sub-pad terminals ROW_PAD_A and the second row sub-pad terminals ROW_PAD_B may all be disposed along the same direction with respect to the first direction. However, the present invention is not limited thereto. For example, the first inclination angle θ1 and the second inclination angle θ2 may be different from each other. Accordingly, the first row sub-pad terminals ROW_PAD_A and the second row sub-pad terminals ROW_PAD_B may be arranged along different directions with respect to the first direction.

Distances between adjacent second row sub-pad terminals ROW_PAD_B may be equal to each other. For example, a distance between the second row sub-pad terminal ROW_PAD_B_1 and the second row sub-pad terminal ROW_PAD_B_2, a distance between the second row sub-pad terminal ROW_PAD_B_2 and the second row sub-pad terminal ROW_PAD_B_3, and a distance between the second row sub-pad terminal ROW_PAD_B_3 and the second row sub-pad terminal ROW_PAD_B_4 may be equal to each other.

The second row sub-pad terminals ROW_PAD_B electrically contact fourth row sub-pad terminals ROW_PAD_D of the printed circuit board 300. The second row sub-pad terminals ROW_PAD_B may have a quadrangular shape. However, the second row sub-pad terminals ROW_PAD_B may also have a polygonal or curved shape.

The plurality of first row sub-pad terminals ROW_PAD_A and the plurality of second row sub-pad terminals ROW_PAD_B may be connected with each other by the plurality of first terminal connection lines TL_CN_A. For example, each of the plurality of first terminal connection lines TL_CN_A may connect one of the plurality of first row sub-pad terminals ROW_PAD_A with one of the plurality of second row sub-pad terminals ROW_PAD_B.

For example, the first row sub-pad terminal ROW_PAD_A_1 and the second row sub-pad terminal ROW_PAD_B_1 may be connected with each other by a first terminal connection line TL_CN_A_1, and the first row sub-pad terminal ROW_PAD_A_2 and the second row sub-pad terminal ROW_PAD_B_2 may be connected to each other by a first terminal connection line TL_CN_A_2. In addition, the first row sub-pad terminal ROW_PAD_A_3 and the second row sub-pad terminal ROW_PAD_B_3 are connected with each other by a first terminal connection line TL_CN_A_3, and the first row sub-pad terminal ROW_PAD_A_4 and the second row sub-pad terminal ROW_PAD_B_4 may be connected with each other by a first terminal connection line TL_CN_A_4.

According to an exemplary embodiment of the present invention, each of the plurality of first terminal connection lines TL_CN_A may have a shape that has at least one bend. For example, as shown in FIG. 5, the first terminal connection line TL_CN_A_1 is extended along the second direction from the second row sub-pad terminal ROW_PAD_B_1 to the first row sub-pad terminal ROW_PAD_A_1. In this case, the first terminal connection line TL_CN_A_1 may be bent in the first direction and then bent again in the second direction. For example, the first terminal connection line TL_CN_A_1 may have a shape that is bent two times.

Connection wires CL is disposed between the display area DA (refer to FIG. 2) and the pad area PNL_PAD (refer to FIG. 2). Thus, the display area DA and the pad area PNL_PAD may be electrically connected with each other through the connection wires CL. The connection wires CL may be connected to a plurality of signal lines, the plurality of signal lines being disposed in the display area DA. In addition, the connection wires CL may be connected to the first pad terminals PAD_TL_A or the plurality of second pad terminals PAD_TL_B of the pad area PNL_PAD.

The plurality of first row sub-pad terminals ROW_PAD_A may be connected to the connection wires CL. For example, the first row sub-pad terminal ROW_PAD_A_1 may be connected with a connection wire CL_1, and the first row sub-pad terminal ROW_PAD_A_2 may be connected with a connection wire CL_2. The first row sub-pad terminal ROW_PAD_A_3 may be connected with a connection wire CL_3, and the first row sub-pad terminal ROW_PAD_A_4 may be connected with a connection wire CL_4.

At least one first dummy pad terminal DM_TL_A may be disposed between a pair of adjacent first row sub-pad terminals, among the plurality of first row sub-pad terminals ROW_PAD_A. For example, a first dummy pad DM_TL_A_1 may be disposed between the first row sub-pad terminal ROW_PAD_A_1 and the first row sub-pad terminal ROW_PAD_A_2, and a first dummy pad terminal DM_TL_A_2 may be disposed between the first row sub-pad terminal ROW_PAD_A_2 and the first row sub-pad terminal ROW_PAD_A_3. In addition, a first dummy pad terminal DM_TL_A_3 may be disposed between the first row sub-pad terminal ROW_PAD_A_3 and the first row sub-pad terminal ROW_PAD_A_4, and a first dummy pad terminal DM_TL_A_4 may be disposed adjacent to the first row sub-pad terminal ROW_PAD_A_4.

In FIG. 5, a first dummy pad terminal DL_TL_A is disposed between every pair of first row sub-pad terminals ROW_PAD_A that are adjacent to each other. However, the present invention is not limited thereto. For example, two or more first dummy pad terminals DM_TL_A may be disposed between a pair of adjacent first row sub-pad terminals ROW_PAD_A.

The direction in which the first row sub-pad terminals ROW_PAD_A are arranged and the direction in which the first dummy pad terminals DM_TL_A are arranged may be parallel to each other. For example, each of the first row sub-pad terminals ROW_PAD_A and each of the first dummy pad terminals DM_TL_A may be arranged along a direction which is inclined by the first inclination angle θ1 with respect to the first direction.

Since at least one first dummy pad terminal DM_TL_A is disposed between a pair of adjacent first row sub-pad terminals ROW_PAD_A, a distance between adjacent first row sub-pad terminals ROW_PAD_A is increased. Accordingly, an occurrence of a capacitive coupling, for example, a capacitive coupling between the first row sub-pad terminals ROW_PAD_A, can be prevented.

In addition, at least one second dummy pad terminal DM_TL_B may be disposed between a pair of adjacent second row sub-pad terminals ROW_PAD_B, among the plurality of second row sub-pad terminals ROW_PAD_B. For example, a second dummy sub-pad terminal ROW_PAD_B_2 may be disposed between the second row sub-pad terminal ROW_PAD_B_1 and the second row sub-pad terminal ROW_PAD_B_2, and a dummy sub-pad terminal DM_TL_B_2 may be disposed between the second row sub-pad terminal ROW_PAD_B_2 and the second row sub-pad terminal ROW_PAD_B_3. A second dummy sub-pad terminal ROW_PAD_B_3 may be disposed between the second row sub-pad terminal ROW_PAD_B_3 and the second row sub-pad terminal ROW_PAD_B_4, and a dummy sub-pad terminal DM_TL_B_4 may be disposed adjacent to the second row sub-pad terminal ROW_PAD_B_4.

In FIG. 5, a dummy pad terminal DM_TL_B is disposed between every pair of second sub-pad terminals ROW_PAD_B that are adjacent to each other. However, the present invention is not limited thereto, and two or more dummy pad terminals DM_TL_B may be disposed between a pair of adjacent second sub-pad terminals ROW_PAD_B.

The direction in which the second row sub-pad terminals ROW_PAD_B are arranged and the direction in which the second dummy pad terminals DM_TL_B are arranged may be parallel to each other. For example, each of the second row sub-pad terminals ROW_PAD_B and each of the second dummy pad terminals DM_TL_B may be arranged along a direction which is inclined by the second inclination angle θ2 with respect to the first direction.

In an exemplary embodiment of the present invention, the angle of the direction in which the first row sub-pad terminals ROW_PAD_A and the second row sub-pad terminals ROW_PAD_B are disposed may be constant such that a large number of terminals as possible can be disposed in a small area.

Referring to FIG. 7 and FIG. 8, each of the first line pad terminals LN_PAD_A, disposed in the first pad portion PAD_1, may be a second pad terminal PAD_TB_B. The second pad terminal PAD_TB_B may be different from the first pad terminal PAD_TL_A. For example, one of the first line pad terminals LN_PAD_A of FIG. 2 may be a second pad terminal PAD_TL_B of FIG. 7. Thus, as shown in FIG. 8, the second pad terminals PAD_TL_B of FIG. 7 may be arranged along the first curved line CL1. In this case, in FIG. 8, all of the second pad terminals PAD_TL_B of FIG. 7 may be inclined in one direction. For example, all of the second pad terminals PAD_TL_B may be inclined in the same direction. As shown in FIG. 8, for example, all of the second pad terminals PAD_TL_B may be inclined in the direction of about 1 o'clock.

Figure 9:
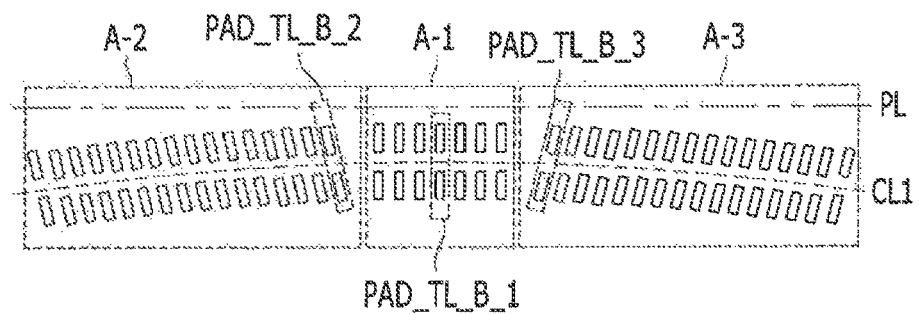
FIG. 9 is a plan view illustrating an arrangement of the second pad terminals of FIG. 8, according to an exemplary embodiment of the present invention.

However, the arrangement format of the second pad terminals PAD_TL_B is not limited thereto, and as shown in FIG. 9, inclination angles and directions of the second pad terminals PAD_TL_B may be different from each other depending on locations of the second pad terminals PAD_TL_B in the first pad portion PAD_1.

FIG. 9 is a plan view illustrating an arrangement of the second pad terminals of FIG. 8, according to an exemplary embodiment of the present invention.

Referring to FIG. 9, an area where the second pad terminals PAD_TL_B are disposed may be divided into a first area A-1, a second area A-2, and a third area A-3. The first area A-1 may correspond to a center area of first pad portion PAD_1, and the second area A-2 and the third area A-3 may respectively correspond to a left area and a right area of the first area A-1.

In the first area A-1, the second pad terminals PAD_TL_B_1 may be perpendicularly disposed. For example, the second pad terminals PAD_TL_B_1 may be disposed in a direction that is perpendicular to the reference line PL, rather than being inclined with respect to the reference line PL. In the second area A-2, the second pad terminals PAD_TL_B_2 may be inclined to the left side (e.g., in a first direction). For example, the second pad terminals PAD_TL_B_2 may be inclined in a direction that is about 11 o'clock (e.g., the first direction). In the third area A-3, the second pad terminals PAD_TL_B_3 may be inclined to the right side (e.g., in a second direction that crosses the first direction). That is, the second pad terminals PAD_TL_B_3 may be inclined in a direction of about 1 o'clock (e.g., the second direction). As shown in FIG. 9, the second pad terminals PAD_TL_B of the second area A-2 and the second pad terminals PAD_TL_B of the third area A-3 may be disposed symmetrically to each other, with respect to an axis that is perpendicular to the reference line PL. Each of the plurality of second pad terminals PAD_TL_B may include a pair of second sub-pad terminals SUB_PAD_B, for example, a second sub-pad terminal SUB_PAD_B_1 and a second sub-pad terminal SUB_PAD_B_2. In addition, each of the plurality of pad terminals PAD_TL_B may include a second terminal connection line TL_CN_B connecting the second sub-pad terminal SUB_PAD_B_1 with the second sub-pad terminal SUB_PAD_B_2.

Every pair of second sub-pad terminals SUB_PAD_B may be disposed at a distance from each other in a certain direction. In an exemplary embodiment of the present invention, a pair of second sub-pad terminals SUB_PAD_B_1 and SUB_PAD_B_2 may be spaced apart from each other in a certain direction. The certain direction, in which the second sub-pad terminals SUB_PAD_B_1 and SUB_PAD_B_2 are arranged, may form a third inclination angle θ3 with respect to the first direction. The third inclination angle θ3 may be between 0 degrees and 90 degrees, exclusive of 0 degrees and 90 degrees.

The second sub-pad terminals SUB_PAD_B electrically contact fourth sub-pad terminals SUB_PAD_D of the printed circuit board 300. The second sub-pad terminals SUB_PAD_B may substantially have a quadrangular shape. However, the second sub-pad terminals SUB_PAD_B may also have a polygonal or curved shape. The second sub-pad terminals SUB_PAD_B may have a rectangular shape that extends in a certain direction. In this case, the second sub-pad terminals SUB_PAD_B_1 and SUB_PAD_B_2 may respectively have rectangular shapes, each having a long side and a short side, and a length of the long side may be, for example, about two times longer than a length of the short side.

Each of the second sub-pad terminals SUB_PAD_B_1 and SUB_PAD_B_2 included in a pair of second sub-pad terminals SUB_PAD_B may be connected with each other by a corresponding second terminal connection line TL_CN_B. For example, the second terminal connection lines TL_CN_B are disposed between the second sub-pad terminals SUB_PAD_B_1 and the second sub-pad terminals SUB_PAD_B_2 to electrically connect each pair of sub-pad terminals SUB_PAD_B_1 and SUB_PAD_B_2.

Hereinafter, the plurality of second line pad terminals LN_PAD_B, disposed in the second pad portion PAD_2 of FIG. 3, will be described with reference to FIG. 10 to FIG. 14.

Figure 10:
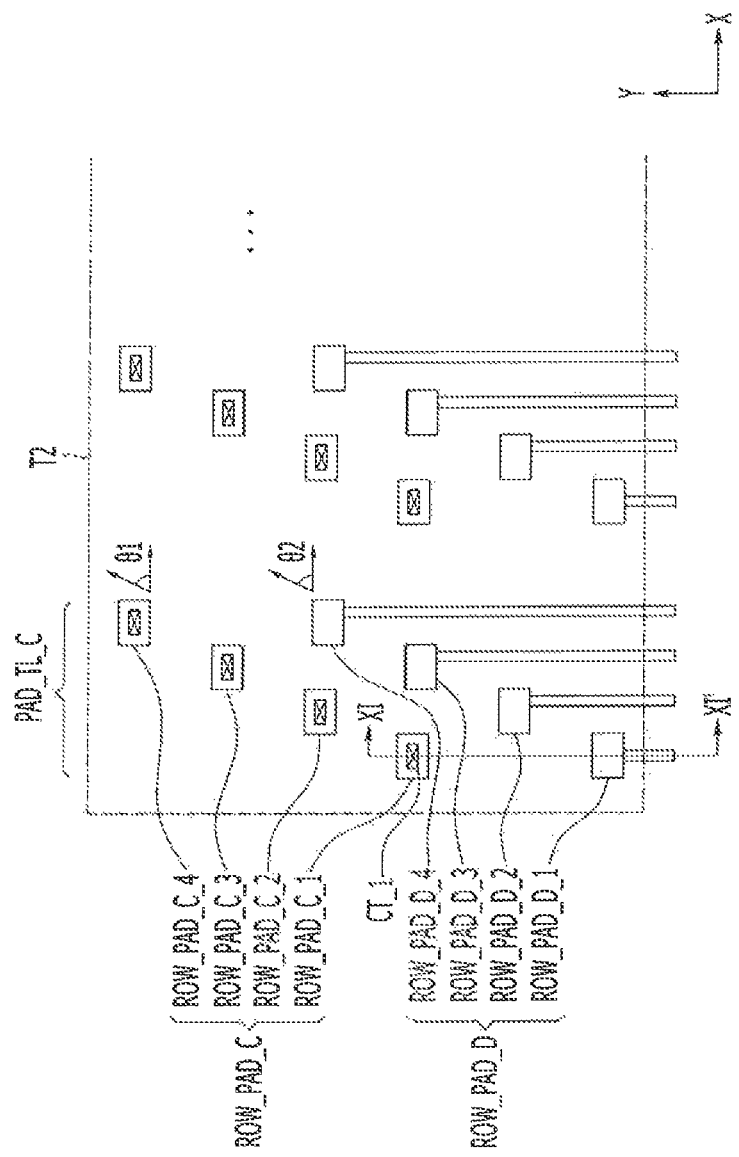
FIG. 10 is an enlarged plan view illustrating the third pad terminals disposed in the area T2 of FIG. 3, according to an exemplary embodiment of the present invention.
Figure 11:
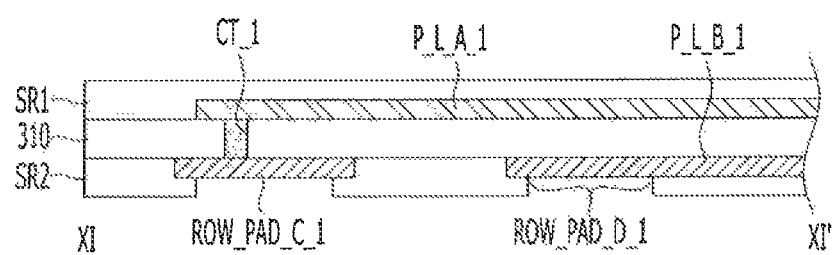
FIG. 11 is a cross-sectional view of FIG. 10, taken along line XI-XI', according to an exemplary embodiment of the present invention.
Figure 12:
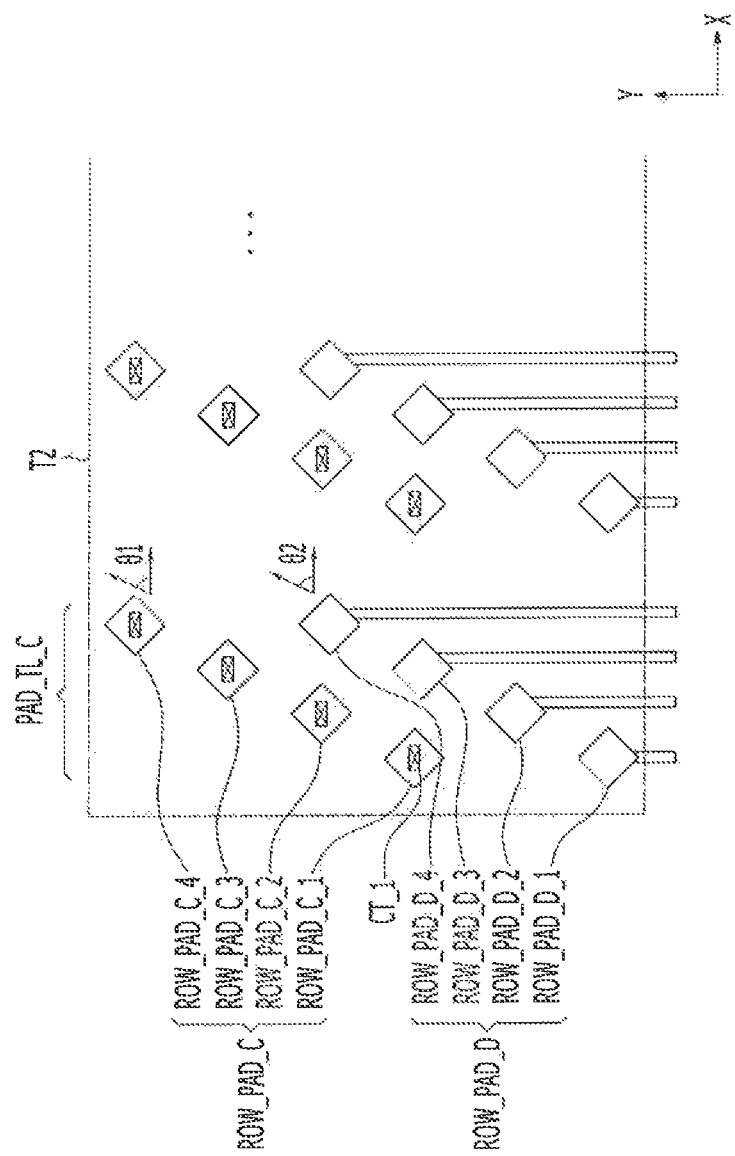
FIG. 12 is a plan view illustrating an arrangement of the third pad terminals of FIG. 10, according to an exemplary embodiment of the present invention.
Figure 13:
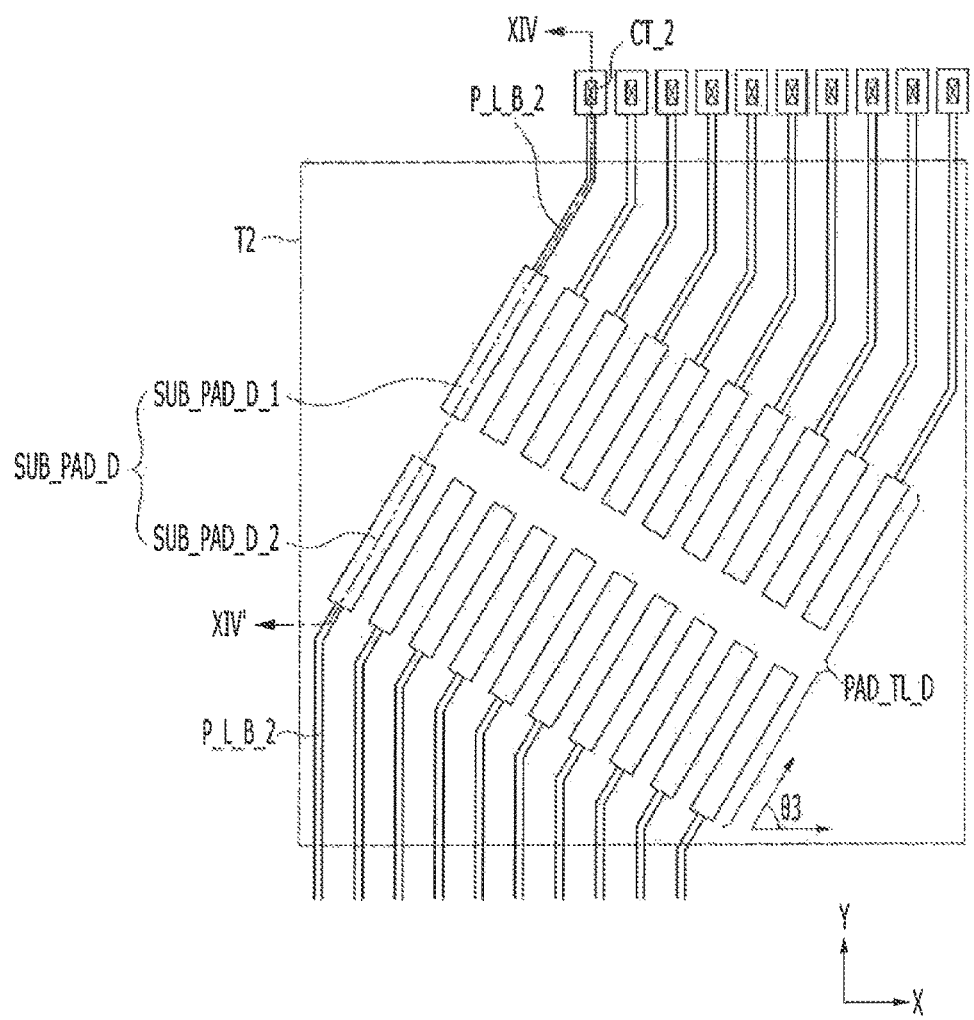
FIG. 13 is an enlarged view illustrating fourth pad terminals disposed in the area T2 of FIG. 3, according to an exemplary embodiment of the present invention.
Figure 14:
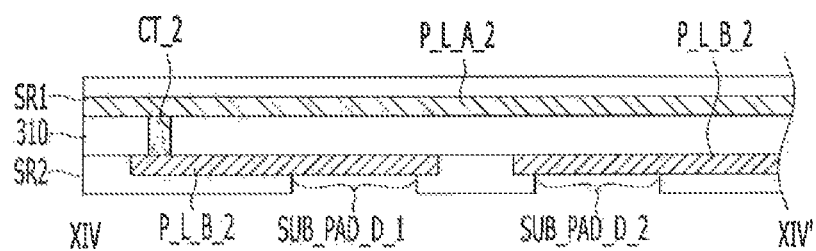
FIG. 14 is a cross-sectional view of FIG. 13, taken along line XIV-XIV', according to an exemplary embodiment of the present invention.

FIG. 10 is an enlarged plan view illustrating the third pad terminals disposed in the area T2 of FIG. 3, according to an exemplary embodiment of the present invention. FIG. 11 is a cross-sectional view of FIG. 10, taken along line XI-XI', according to an exemplary embodiment of the present invention. FIG. 12 is a plan view illustrating an arrangement of the third pad terminals of FIG. 10, according to an exemplary embodiment of the present invention. FIG. 13 is an enlarged view illustrating fourth pad terminals disposed in the area T2 of FIG. 3, according to an exemplary embodiment of the present invention. FIG. 14 is a cross-sectional view of FIG. 13, taken along line XIV-XIV', according to an exemplary embodiment of the present invention.

Referring to FIG. 10 and FIG. 11, the second line pad terminals LN_PAD_B, disposed in the second pad portion PAD_2, may be third pad terminals PAD_TL_C. For example, a second line pad terminal LN_PAD_B of FIG. 3 may be a third pad terminal PAD_TL_C of FIG. 10. The plurality of third pad terminals PAD_TL_C may be arranged with the same pattern as the arrangement pattern of the first pad terminals PAD_TL_A.

Each of the plurality of third pad terminals PAD_TL_C may include third row sub-pad terminals ROW_PAD_C and fourth row sub-pad terminals ROW_PAD_D.

In an exemplary embodiment of the present invention, the third row sub-pad terminals ROW_PAD_C may be spaced apart from each other along a certain direction. The certain direction, in which the first row sub-pad terminals ROW_PAD_A are arranged, may form the first inclination angle θ1 with respect to the first direction. The first inclination angle θ1 may be between 0 degrees and 90 degrees, exclusive of 0 degrees and 90 degrees.

Distances between adjacent third row sub-pad terminals ROW_PAD_C may be equal to each other. For example, a distance between a third row sub-pad terminal ROW_PAD_C_1 and a third row sub-pad terminal ROW_PAD_C_2, a distance between a third row sub-pad terminal ROW_PAD_C_2 and a third row sub-pad terminal ROW_PAD_C_3, and a distance between a third row sub-pad terminal ROW_PAD_C_3 and a third row sub-pad terminal ROW_PAD_C_4 may be equal to each other. In this case, adjacent third row sub-pad terminals ROW_PAD_C may be spaced apart from each other by the same distance as the distance by which adjacent first row sub-pad terminals ROW_PAD_A are spaced apart from each other.

The third row sub-pad terminals ROW_PAD_C electrically contact the first row sub-pad terminals ROW_PAD_A of the display substrate SUB. The third row sub-pad terminals ROW_PAD_C may have a quadrangular shape. However, the present invention is not limited thereto, and as shown in FIG. 12, each of the third row sub-pad terminals ROW_PAD_C may have a rhombus shape. In addition, the third row sub-pad terminals ROW_PAD_A may also have a polygonal or curved shape.

Second terminal wires P_L_B_1, connected to the fourth row sub-pad terminals ROW_PAD_D, may be coupled to vertices of the rhombus shapes. However, the present invention is not limited thereto. The second terminal wires P_L_B_1 may be coupled to locations other than the vertices of the rhombus shapes of the fourth row sub-pad terminals ROW_PAD_D.

The fourth row sub-pad terminals ROW_PAD_D may be spaced apart from the third row sub-pad terminals ROW_PAD_C in the second direction. The fourth row sub-pad terminals ROW_PAD_D may be spaced apart from each other along a certain direction.

The certain direction, in which the fourth row sub-pad terminals ROW_PAD_D are arranged, may form the second inclination angle θ2 with respect to the first direction.

Accordingly, the fourth row sub-pad terminals ROW_PAD_D may be inclined by the same angle as the second row sub-pad terminals ROW_PAD_B of the display substrate SUB. The second inclination angle θ2 may be between 0 degrees and 90 degrees, exclusive of 0 degrees and 90 degrees.

In an exemplary embodiment of the present invention, the first inclination angle θ1 and the second inclination angle θ2 may be equal to each other. Thus, the direction in which the third row sub-pad terminals ROW_PAD_C and the direction in which the fourth row sub-pad terminals ROW_PAD_D extend may be the same (e.g., inclined by the same direction with respect to the first direction).

However, the present invention is not limited thereto. Thus, the first inclination angle θ1 and the second inclination angle θ2 may be different from each other. Accordingly, the direction in which the third row sub-pad terminals ROW_PAD_C and the direction in which the fourth row sub-pad terminals ROW_PAD_D extend may be different from each other (e.g., inclined by different angles with respect to the first direction).

Distances between adjacent fourth row sub-pad terminal ROW_PAD_D may be equal to each other. For example, a distance between a fourth row sub-pad terminal ROW_PAD_D_1 and a fourth row sub-pad terminal ROW_PAD_D_2, a distance between the fourth row sub-pad terminal ROW_PAD_D_2 and a fourth row sub-pad terminal ROW_PAD_D_3, and a distance between the fourth row sub-pad terminal ROW_PAD_D_3 and a fourth row sub-pad terminal ROW_PAD_D_4 may be equal to each other.

The fourth row sub-pad terminals ROW_PAD_D electrically contact the second row sub-pad terminals ROW_PAD_B of the display substrate SUB. The fourth row sub-pad terminals ROW_PAD_D may substantially have a quadrangular shape. However, the present invention is not limited thereto, and as shown in FIG. 12, each of the fourth row sub-pad terminals ROW_PAD_D may have a rhombus shape. In addition, the fourth row sub-pad terminals ROW_PAD_D may also have a polygonal or curved shape.

A first terminal wire P_L_A_1 and a second terminal wire P_L_B_1 may be disposed at lateral sides of the printed circuit board 300. The base film 310 may be disposed between the first terminal wire P_L_A_1 and the second terminal wire P_L_B_1. The first terminal wire P_L_A_1 may be disposed above the base film 310, and the second terminal wire P_L_B_1 may be disposed below the base film 310. The first terminal wire P_L_A_1 and the second terminal wire P_L_B_1 may be electrically connected with the driving chip 350.

A first protective layer SR1 may be disposed on the first terminal wire P_L_A_1, and a second protective layer SR2 may be disposed on the second terminal wire P_L_B_1. The first protective layer SR1 and the second protective layer SR2 may be solder resists.

The third row sub-pad terminal ROW_PAD_C_1 and the fourth row sub-pad terminal ROW_PAD_D_1 may be formed from the same layer from which the second terminal wire P_L_B_1 is formed. The second terminal wire P_L_B_1 may be partially exposed by partially removing the second protective layer SR2 to form the third row sub-pad terminal ROW_PAD_C_1 and the fourth row sub-pad terminal ROW_PAD_D_1. In this case, the third row sub-pad terminal ROW_PAD_C_1 and the fourth row sub-pad terminal ROW_PAD_D_1 may be spaced apart from each other.

The third row sub-pad terminal ROW_PAD_C_1 may be electrically connected with the first terminal wire P_L_A_1 through a first contact hole CT_1, disposed in the base film 310. In plan view, the first contact hole CT_1 may be overlapped with the third row sub-pad terminal ROW_PAD_C_1. In this case, the first contact hole CT_1 may be filled with a metal that is the same as a metal included in the first terminal wire P_L_A_1 or a metal that is included in the third row sub-pad terminal ROW_PAD_C_1.

The fourth row sub-pad terminal ROW_PAD_D_1 may be included in the same metal layer as the second terminal wire P_L_B_1. In an exemplary embodiment of the present invention, the fourth row sub-pad terminal ROW_PAD_D_1 may be a partially exposed area of the second terminal wire P_L_B_1.

Referring to FIG. 13 and FIG. 14, the second line pad terminals LN_PAD_B, disposed in the second pad portion PAD_2, may be the third and fourth pad terminals PAD_TL_C and PAD_TL_D. For example, one of the second line pad terminals LN_PAD_B of FIG. 3 may be a fourth pad terminal PDA_TL_D of FIG. 13. The plurality of fourth pad terminals PAD_TL_D may be arranged with the same pattern as the arrangement pattern of the second pad terminals PAD_TL_B.

Each of the plurality of fourth pad terminals PAD_TL_D may include a pair of pair of fourth sub-pad terminals SUB_PAD_D. For example, a pair of fourth sub-pad terminals SUB_PAD_D may include a fourth sub-pad terminal SUB_PAD_D_1 and a fourth sub-pad terminal SUB_PAD_D_2.

The pair of fourth sub-pad terminals SUB_PAD_D may be spaced apart from each other in a certain direction. In an exemplary embodiment of the present invention, the pair of the fourth sub-pad terminals SUB_PAD_D_1 and SUB_PAD_D_2 may be spaced apart from each other in a certain direction. The certain direction, in which the fourth sub-pad terminals SUB_PAD_D_1 and SUB_PAD_D_2 are arranged, may form a third inclination angle θ3 with respect to the first direction. The third inclination angle θ3 may be the same as the angle formed by the second sub-pad terminals SUB_PAD_B of the display substrate SUB of FIG. 7, with respect to the first direction.

The fourth sub-pad terminal SUB_PAD_D electrically contacts the second sub-pad terminal SUB_PAD_B of the display substrate SUB. The fourth sub-pad terminal SUB_PAD_D may have a quadrangular shape. In an exemplary embodiment of the present invention, the fourth sub-pad terminal SUB_PAD_D may have an extended rectangular shape. In this case, each of the fourth sub-pad terminals SUB_PAD_D_1 and SUB_PAD_D_2 has a rectangular shape having a long side and a short side that neighbor each other. A length of the long side may be, for example, about two times longer than a length of the short side.

In the printed circuit board 300, a first terminal wire P_L_A_2 and a second terminal wire P_L_B_2 may be disposed at lateral sides of the printed circuit board 300. The base film 310 may be disposed between the first terminal wire P_L_A_2 and the second terminal wire P_L_B_2. The first terminal wire P_L_A_2 may be disposed above the base film 310, and the second terminal wire P_L_B_2 may be disposed below the base film 310. The first terminal wire P_L_A_2 and the second terminal wire P_L_B_2 may be electrically connected with the driving chip 350.

The fourth sub-pad terminals SUB_PAD_D_1 and SUB_PAD_D_2 may be formed from the same layer from which the second terminal wire P_L_B_2 is formed. The second protective layer SR2 may be partially removed to expose the second terminal wire P_L_B_2 such that the fourth sub-pad terminals SUB_PAD_D_1 and SUB_PAD_D_2 can be formed. In this case, the fourth sub-pad terminals SUB_PAD_D_1 and SUB_PAD_D_2 may be spaced apart from each other.

The fourth sub-pad terminal SUB_PAD_D_1 may be electrically connected with the first terminal wire P_L_A_2 through a second contact hole CT2 formed in the base film 310. In plan view, the fourth sub-pad terminal SUB_

PAD_D_1 and the second contact hole CT_2 are arranged to not be overlapped with each other. The second terminal wire P_L_B_2 may extend in the second direction from the fourth sub-pad terminal SUB_PAD_D_1. In addition, the second contact hole CT_2 may overlap the second terminal wire P_L_B_2. In this case, the second contact hole CT_2 may be filled with a metal included in the first terminal wire P_L_A_2 or a metal included in the fourth sub-pad terminal SUB_PAD_D_1.

The fourth sub-pad terminal SUB_PAD_D_2 may be included in the same metal layer as the second terminal wire P_L_B_2. In an exemplary embodiment of the present invention, the fourth sub-pad terminal SUB_PAD_D_2 may be a partially exposed area of the second terminal wire P_L_B_2.

Hereinafter, a coupling state of the first pad terminals PAD_TL_A and the third pad terminals PAD_TL_C, and a coupling state of the second pad terminals PAD_TL_B and the fourth pad terminal PAD_TL_D will be described in detail with reference to FIG. 15 to FIG. 18.

Figure 15:
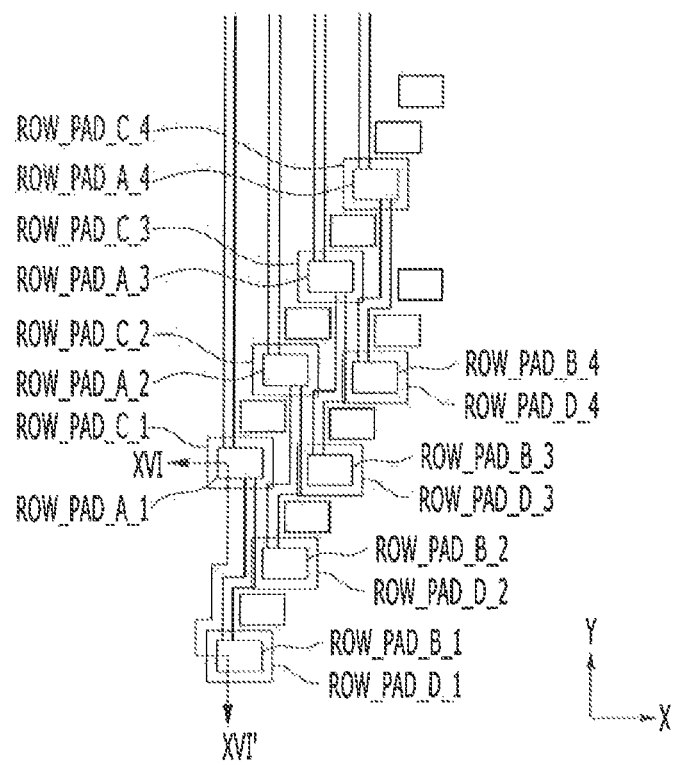
FIG. 15 is a plan view illustrating a coupling state of the first pad terminals of the display substrate and the third pad terminals of the printed circuit board, according to an exemplary embodiment of the present invention.
Figure 16:
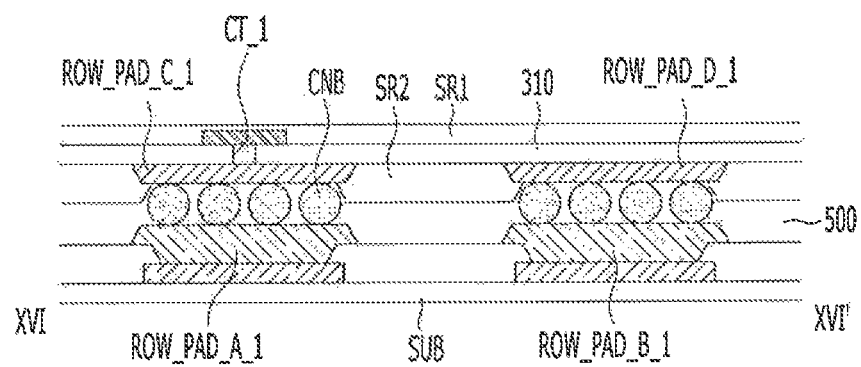
FIG. 16 is a cross-sectional view of FIG. 15, taken along line XVI-XVI', according to an exemplary embodiment of the present invention.
Figure 17:
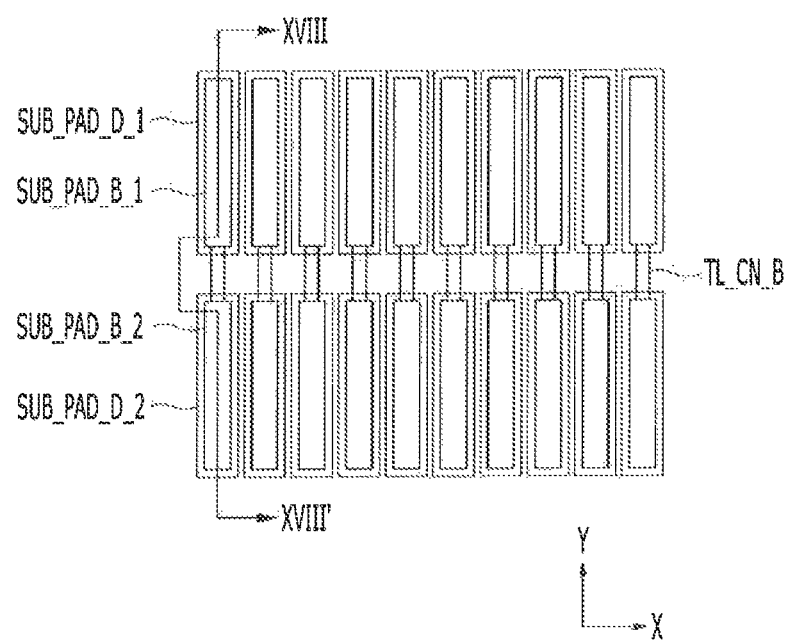
FIG. 17 is a plan view illustrating a coupling state of the second pad terminals of the display substrate and the fourth pad terminals of the printed circuit board, according to an exemplary embodiment of the present invention.
Figure 18:
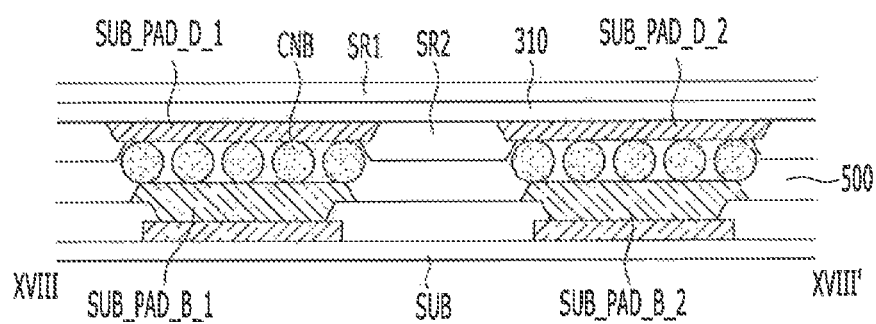
FIG. 18 is a cross-sectional view of FIG. 17, taken along line XVIII-XVIII', according to an exemplary embodiment of the present invention.

FIG. 15 is a plan view illustrating a coupling state of the first pad terminals of the display substrate and the third pad terminals of the printed circuit board, according to an exemplary embodiment of the present invention. FIG. 16 is a cross-sectional view of FIG. 15, taken along line XVI-XVI', according to an exemplary embodiment of the present invention. FIG. 17 is a plan view illustrating a coupling state of the second pad terminals of the display substrate and the fourth pad terminals of the printed circuit board, according to an exemplary embodiment of the present invention. FIG. 18 is a cross-sectional view of FIG. 17, taken along line XVIII-XVIII', according to an exemplary embodiment of the present invention.

Referring to FIG. 15 and FIG. 16, the third pad terminals PAD_TL_C (refer to FIG. 10) may be disposed on the first pad terminals PAD_TL_A (refer to FIG. 5) to overlap the first pad terminals PAD_TL_A. For example, the third row sub-pad terminals ROW_PAD_C may be overlapped by the first row sub-pad terminals ROW_PAD_A, and the fourth row sub-pad terminals ROW_PAD_D may be overlapped by the second row sub-pad terminals ROW_PAD_B.

Conductive adhesion films 500 may be disposed between the third pad terminals PAD_TL_C (refer to FIG. 10) on the first pad terminals PAD_TL_A (refer to FIG. 5). The conductive adhesion films 500 may electrically connect the first row sub-pad terminals ROW_PAD_A and the third row sub-pad terminals. An electrical connection can be established between the first row sub-pad terminals ROW_PAD_A and the third row sub-pad terminals ROW_PAD_C through a plurality of conductive balls CNB included in each of the conductive adhesion films 500.

Referring to FIG. 17 and FIG. 18, when the printed circuit board 300 is coupled to the pad area PNL_PAD of the display substrate SUB, the second sub-pad terminals SUB_PAD_B_1 and SUB_PAD_B_2 and the fourth sub-pad terminal SUB_PAD_D_1 and SUB_PAD_D_2 can be disposed to be overlapped with each other.

For example, the first sub-pad terminals SUB_PAD_D_1 may be disposed to be overlapped on the second sub-pad terminal SUB_PAD_B_L and the fourth sub-pad terminals SUB_PAD_D_2 may be disposed to be overlapped on the second sub-pad terminals SUB_PAD_B_2.

In addition, the conductive adhesion films 500 may be respectively disposed between the second sub-pad terminals SUB_PAD_B_1 and SUB_PAD_B_2 and the fourth sub-pad terminals SUB_PAD_D_1 and SUB_PAD_D_2. The conductive adhesion film 500 may electrically connect the second sub-pad terminals SUB_PAD_B_1 and SUB_PAD_B_2 and the fourth sub-pad terminals SUB_PAD_D_1 and SUB_PAD_D_2 with each other. The second sub-pad terminals SUB_PAD_B_1 and SUB_PAD_B_2 and the fourth sub-pad terminals SUB_PAD_D_1 and SUB_PAD_D_2 can be electrically connected with each other through a plurality of conductive balls CNB included in the conductive adhesion film 500.

Hereinafter, a display device, according to an exemplary embodiment of the present invention, will be described with reference to FIG. 19 to FIG. 22. A repetitive description of configurations described above may be omitted for brevity.

Figure 19:
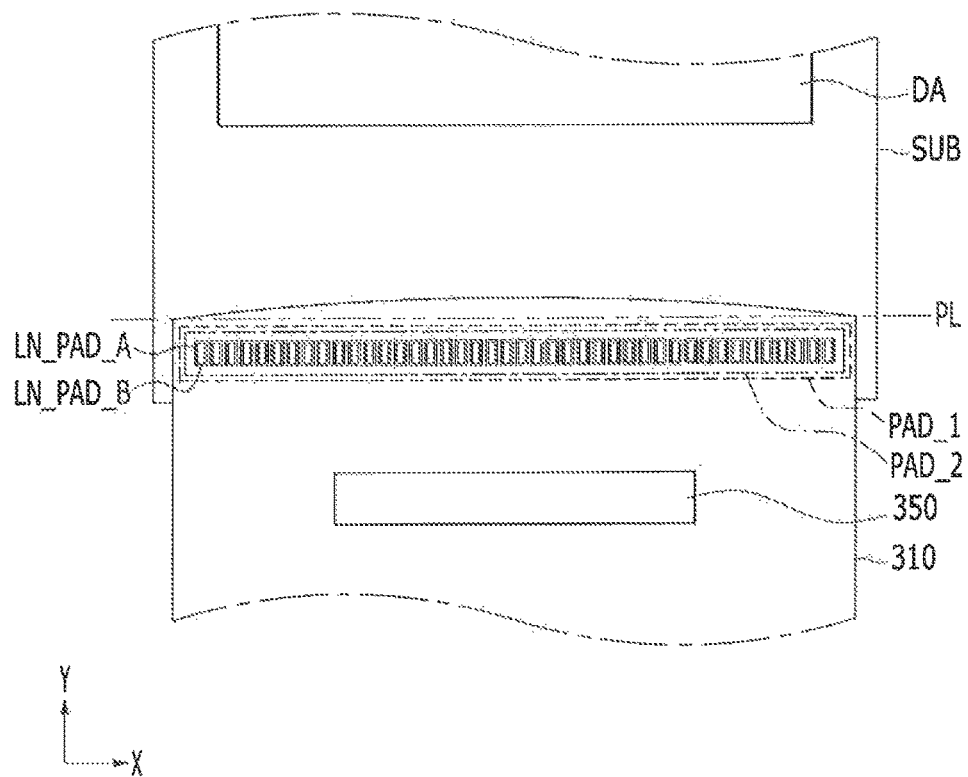
FIG. 19 is a plan view illustrating a display device, according to an exemplary embodiment of the present invention.
Figure 20:
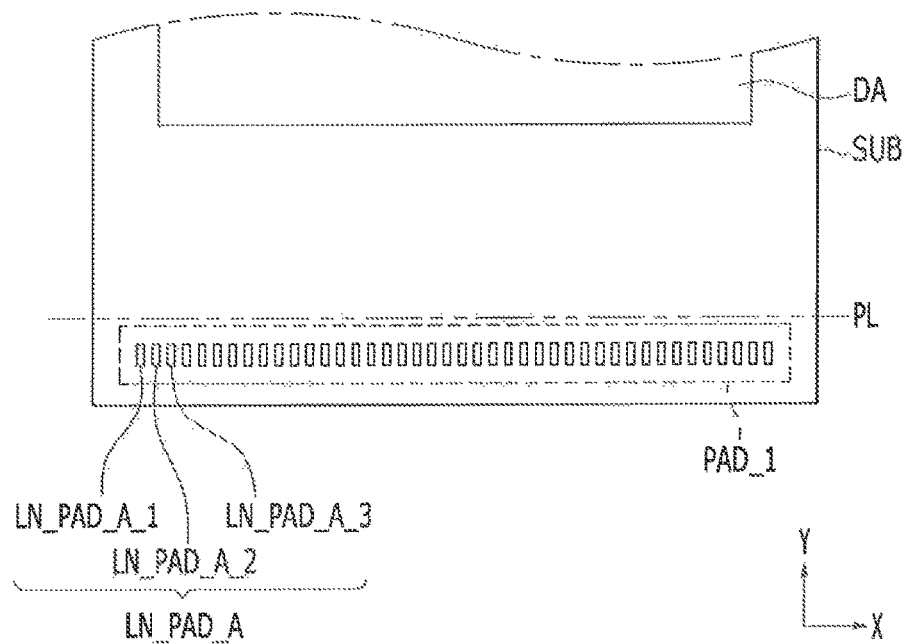
FIG. 20 is a plan view illustrating the display substrate of FIG. 19, according to an exemplary embodiment of the present invention.
Figure 21:
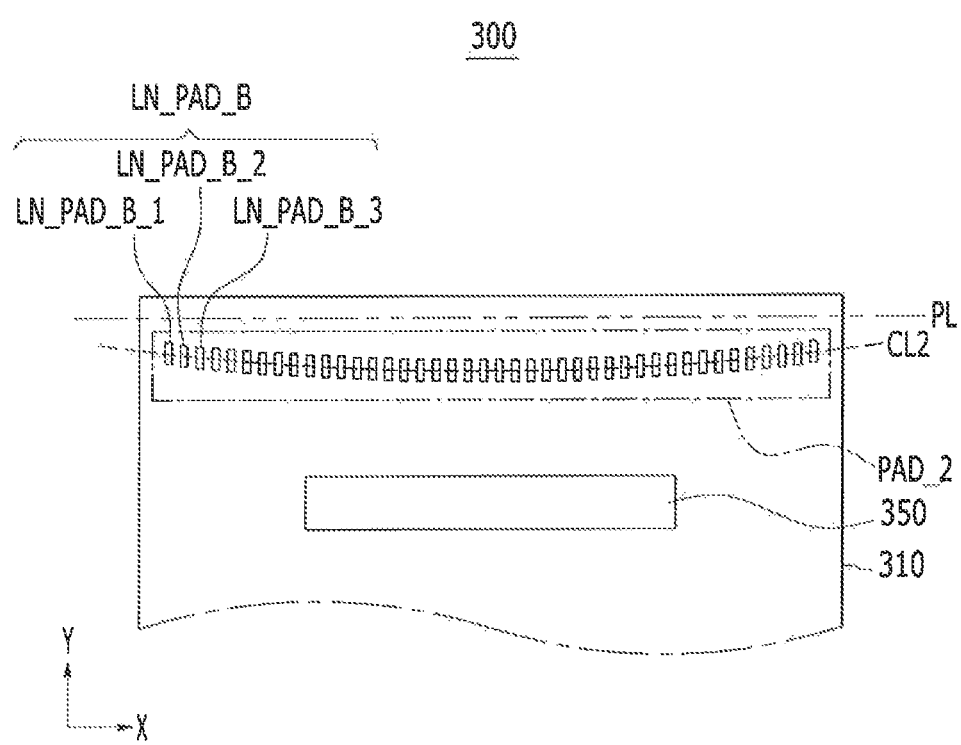
FIG. 21 is a plan view illustrating a printed circuit board before being attached to a display substrate, according to an exemplary embodiment of the present invention.
Figure 22:
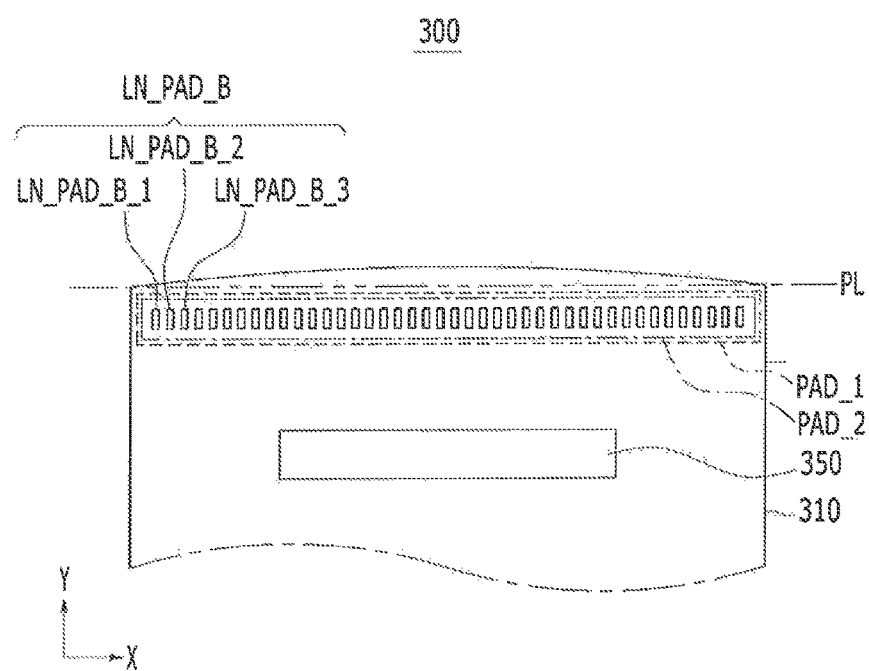
FIG. 22 is a plan view illustrating the printed circuit board after being attached to the display substrate, according to an exemplary embodiment of the present invention.

FIG. 19 is a plan view illustrating a display device, according to an exemplary embodiment of the present invention. FIG. 20 is a plan view illustrating the display substrate of FIG. 19, according to an exemplary embodiment of the present invention. FIG. 21 is a plan view illustrating a printed circuit board before being attached to a display substrate, according to an exemplary embodiment of the present invention. FIG. 22 is a plan view illustrating the printed circuit board after being attached to the display substrate, according to an exemplary embodiment of the present invention.

Referring to FIG. 19, first line pad terminals LN_PAD_A and second line pad terminals LN_PAD_B are arranged in a format of a straight line. The first line pad terminals LN_PAD_A and the second line pad terminals LN_PAD_B may be overlapped with each other.

A plurality of first line pad terminals LN_PAD_A may be arranged in a first pad portion PAD_1. The plurality of first line pad terminals LN_PAD_A may be electrically connected with the second line pad terminals LN_PAD_B of the printed circuit board 300. The plurality of first line pad terminals LN_PAD_A and the second line pad terminals LN_PAD_B are overlapped with each other, and conductive adhesion films 500 (refer to FIG. 16) may be disposed between the first line pad terminals LN_PAD_A and the second line pad terminals LN_PAD_B for electrical connection therebetween. Thus, signals for driving a display panel can be transmitted to the display panel through the second line pad terminals LN_PAD_B and the first line pad terminals LN_PAD_A.

Referring to FIG. 20, the plurality of first line pad terminals LN_PAD_A may be arranged in parallel with each other in a format of a straight line. For example, the first line pad terminals LN_PAD_A_1, LN_PAD_A_2, and LN_PAD_A_3 may be arranged in the straight line format along a first direction.

Every pair of first line pad terminals LN_PAD_A, from among the plurality of first line pad terminals LN_PAD_A, that are adjacent to each other may have the same distance therebetween. For example, the plurality of first line pad terminals LN_PAD_A may be arranged with the same interval in the first direction. However, the present invention is not limited thereto. For example, a distance between a first pair of adjacent first line pad terminals LN_PAD_A may be different from a distance between a second pair of adjacent first line pad terminals LN_PAD_A.

Referring to FIG. 21, the printed circuit board 300 may include a base film 310, a second pad portion PAD_2, and a driving chip 350.

The second pad portion PAD_2 may be disposed at an end of the base film 310. The base film 310 may be flexible. As described above, when the printed circuit board 300 is attached to a pad area PNL_PAD of the display substrate SUB, the second pad portion PAD_2 and a first pad portion PAD_1 can be electrically connected with each other.

The plurality of second line pad terminals LN_PAD_B may be disposed in the second pad portion PAD_2. When the printed circuit board 300 is attached to the pad area PNL_PAD of the display substrate SUB, the plurality of second line pad terminals LN_PAD_B may be overlapped with the plurality of first line pad terminals LN_PAD_A.

The plurality of second line pad terminals LN_PAD_B may be arranged along a second curved line CL2. For example, second line pad terminals LN_PAD_B_1, LN_PAD_B_2, and LN_PAD_B_3 may be arranged along the second curved line CL2 in the first direction.

In an exemplary embodiment of the present invention, the second a curved line CL2 may have a curved shape like the first curved line CL1. For example, the second a curved line CL2 may have a convex center area. However, the second curved line CL2 is symmetrical to the first curved line, with respect to a reference line PL that is parallel with the first direction. For example, the second curved line CL2 may be curved toward the driving chip 350. In addition, sides of the second curved line CL2 may be symmetrical to each other, with respect to their respective centers.

FIG. 21 shows the printed circuit board 300 before being attached to the display substrate SUB. The plurality of second line pad terminals LN_PAD_B are arranged along the second curved line CL2 before the printed circuit board 300 is attached to the display substrate SUB.

After the printed circuit board 300 is attached to the display substrate SUB, the plurality of first line pad terminals LN_PAD_A and the plurality of second line pad terminals LN_PAD_B are overlapped with each other. Thus, the plurality of first line pad terminals LN_PAD_A and the plurality of second line pad terminals LN_PAD_B may be arranged in the same format (for example, along the same alignment and overlapping each other).

However, before the printed circuit board 300 is attached to the display substrate SUB, as shown in FIG. 21, the second line pad terminals LN_PAD_B may be arranged in a format that is different from that of the first line pad terminals LN_PAD_A. For example, the plurality of first line pad terminals LN_PAD_A in FIG. 20 are arranged in a straight line format, but the plurality of second line pad terminals LN_PAD_B of FIG. 21 are arranged along the second curved line CL2.

Referring to FIG. 22, when the printed circuit board 300 is coupled to the display substrate SUB, the plurality of second line pad terminals LN_PAD_B, disposed in the printed circuit board 300, may be arranged in the straight line format like the plurality of first line pad terminals LN_PAD_A described above. Thus, the arrangement format of the second line pad terminals LN_PAD_B may be changed while the printed circuit board 300 is attached to the display substrate SUB. For example, the arrangement format of the second line pad terminals LN_PAD_B may be changed to the straight line format from the curved format of the curved line CL2.

Hereinafter, a detailed structure of the plurality of second line pad terminals LN_PAD_B of FIG. 21 will be described with reference to FIG. 23 and FIG. 24.

Figure 23:
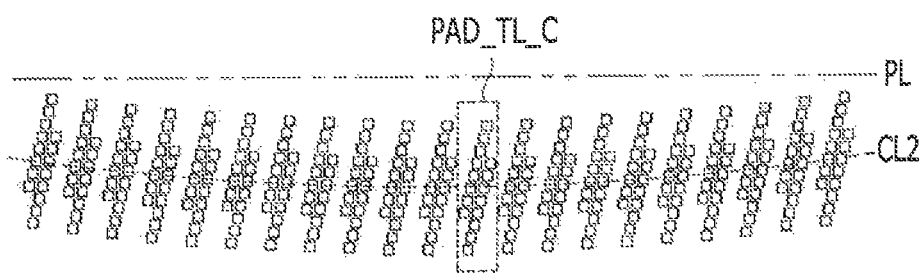
FIG. 23 is a plan view illustrating an arrangement of the third pad terminals of FIG. 21, according to an exemplary embodiment of the present invention.

FIG. 23 is a plan view illustrating an arrangement of the third pad terminals of FIG. 21, according to an exemplary embodiment of the present invention. FIG. 24 is a plan view illustrating an arrangement of the fourth pad terminals of FIG. 21, according to an exemplary embodiment of the present invention.

Referring to FIG. 23, each of the second line pad terminals LN_PAD_B, disposed in a second pad portion PAD_2, may be a third pad terminal PAD_TL_C. For example, each second line pad terminal LN_PAD_B of FIG. 21 may be a third pad terminal PAD_TL_C of FIG. 10. Thus, as shown in FIG. 23, the third pad terminals PAD_TL_C of FIG. 10 may be arranged along the second curved line CL2, in an exemplary embodiment of the present invention.

Figure 24:
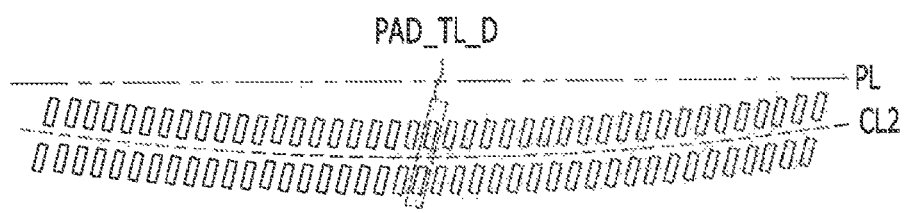
FIG. 24 is a plan view illustrating an arrangement of the fourth pad terminals of FIG. 21, according to an exemplary embodiment of the present invention.

Referring to FIG. 24, each of the second line pad terminals LN_PAD_B, disposed in the second pad portion PAD_2, may be a fourth pad terminal PAD_TL_D. For example, each of the second line pad terminals LN_PAD_B of FIG.21 may be a fourth pad terminal PAD_TL_D of FIG. 13. Thus, as shown in FIG. 24, the fourth pad terminals PAD_TL_D of FIG. 13 may be arranged along the second curved line CL2, in an exemplary embodiment of the present invention.

Hereinafter, a display device, according to an exemplary embodiment of the present invention, will be described with reference to FIG. 25. A repetitive description of configurations described above may be omitted for brevity.

Figure 25:
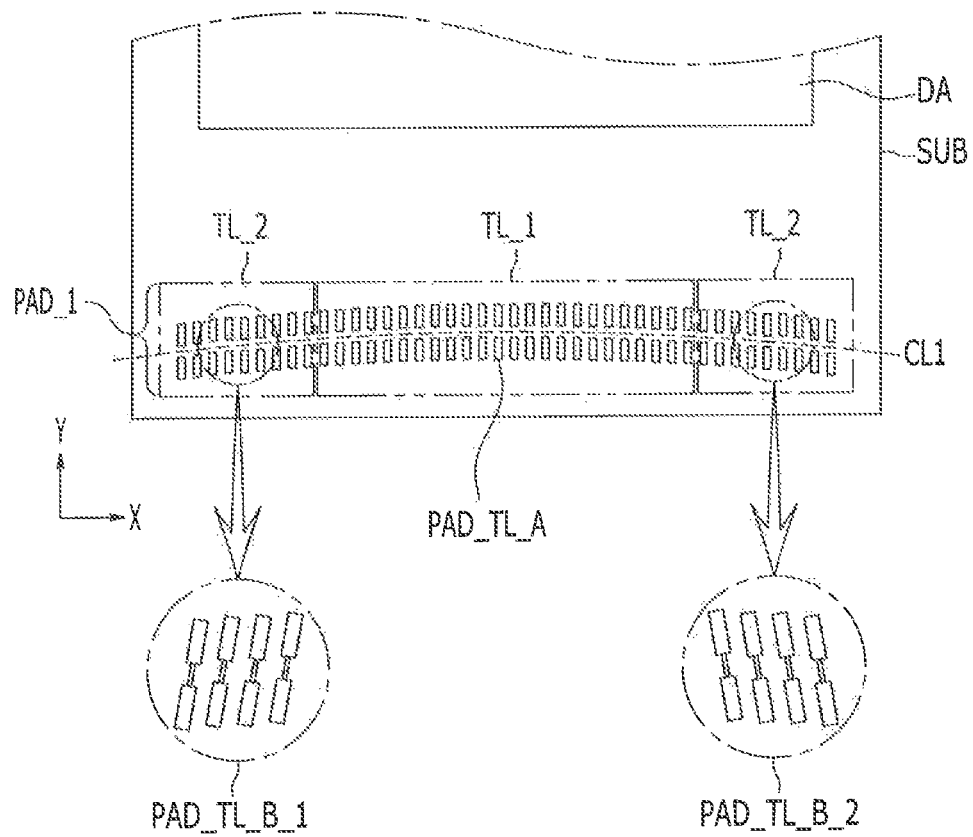
FIG. 25 is a plan view illustrating a display device, according to an exemplary embodiment of the present invention.

FIG. 25 is a plan view illustrating a display device, according to an exemplary embodiment of the present invention.

Referring to FIG. 25, in an exemplary embodiment of the present invention, a first terminal area TL_1 and a second terminal area TL_2 are formed in a first pad portion PAD_1 of a display substrate SUB. The display substrate SUB is coupled with a printed circuit board 300. A plurality of first pad terminals PAD_TL_A are disposed in the first terminal area TL_1 and a plurality of second pad terminals PAD_TL_B are disposed in the second terminal area TL_2. The first pad terminals PAD_TL_A and the second pad terminals PAD_TL_B may have different patterns (e.g., different arrangements).

The plurality of first pad terminals PAD_TL_A (refer to FIG. 5) may be arranged in the first terminal area TL_1, and the plurality of second pad terminals PDA_TL_B (refer to FIG. 7) may be arranged in the second terminal area TL_B. The plurality of first pad terminals PAD_TL_A may be arranged to have a first pattern (e.g., a first arrangement layout) in the first terminal area TL_1.

In addition, the plurality of second pad terminals PAD_TL_B may be arranged to have a second pattern (e.g., a second arrangement layout), that is different from the first pattern, in the second terminal area TL_2. Here, the term, "pattern" may indicate a shape or an arrangement layout of the pad terminals in the first terminal area TL_1 and the second terminal area TL_2.

However, in an exemplary embodiment of the present invention, the plurality of first pad terminals PAD_TL_A (refer to FIG. 5), disposed in the first terminal area TL_1, and the plurality of second pad terminals PDA_TL_B (refer to FIG. 7), disposed in the second terminal area TL_B, may be arranged along the curved line CL1.

The plurality of second pad terminals PAD_TL_B of the second terminal area TL_2 may be arranged to be symmetrical to each other, with respect to the center of the first terminal area TL_1. For example, the plurality of second pad terminals PAD_TL_B (e.g., PAD_TL_B_1), disposed in the left second terminal area TL_2, may be inclined in a direction of about 1 o'clock. In addition, the plurality of second pad terminals PAD_TL_B (e.g., PAD_TL_B_2), disposed in the right second terminal area TL_2, may be inclined in a direction of about 11 o'clock. For example, as shown in FIG. 25, the plurality of second pad terminals PDA_TL_B_1 and the plurality of second pad terminals PDA_TL_B_2 may be arranged to be symmetrical to each other, with respect to the Y-axis.

In a display device, according to an exemplary embodiment of the present invention, pad terminals disposed in the printed circuit board 300 or the display substrate SUB may be arranged in a curved line format in consideration of the deformation of the base film 310, the deformation of the base film 310 occurring when the printed circuit board 300 is attached to the display substrate SUB. Thus, a misalignment that may have otherwise occurred between the first line pad terminals LN_PAD_A and the second line pad terminals LN_PAD_B, when the printed circuit board 300 is attached to the display substrate SUB, can be prevented.

According to an exemplary embodiment of the present invention, a misalignment between the pad terminals of a printed circuit board and the pad terminals of a display substrate can be prevented in a case when the pad terminals of a printed circuit board and the pad terminals of a display substrate overlap each other.

While the present invention has been particularly shown and described with reference to exemplary embodiments thereof, it will be apparent to those of ordinary skill in the art that various changes in form and detail may be made therein without departing from the spirit and scope of the present invention as defined by the following claims.

What is claimed is:

1. A display device, comprising:
    a display substrate comprising a display area where an image is displayed and a pad area disposed at a periphery of the display area; and
    a first pad portion disposed in the pad area, the first pad portion comprising a plurality of first line pad terminals arranged along a first curved line in a first direction,
    wherein the plurality of first line pad terminals include a first pad terminal, and
    the first pad comprises:
    a plurality of first row sub-pad terminals arranged in parallel with each other and having a first inclination angle with respect to the first direction:
    a plurality of second row sub-pad terminals spaced apart from each other, arranged in parallel with each other and having a second inclination angle with respect to the first direction; and
    a plurality of terminal connection lines, each connecting one of the plurality of first row sub-pad terminals with one of the plurality of second row sub-pad terminals, wherein at least one of the plurality of terminal connection lines is bent.

2. The display device of claim 1, wherein the first curved line has a curved shape.

3. The display device of claim 2, wherein the first curved line is convexly curved toward the display area.

4. The display device of claim 3, wherein sides of the first curved line are symmetrical with respect to the center of the first curved line.

5. The display device of claim 3, wherein the plurality of first line pad terminals include a first line pad terminal, a second line pad terminal and a third line pad terminal, wherein the first and second line pad terminals are separated from each other by a first distance, and the second and third line pad terminals are separated from each other by a second distance equal to the first distance.

6. The display device of claim 1, wherein the first inclination angle and the second inclination angle are equal to each other.

7. The display device of claim 6, wherein each of the first inclination angle and the second inclination angle is between 0 degrees and 90 degrees.

8. The display device of claim 3, wherein some of the plurality of first line pad terminals comprise first pad terminals arranged with a first pattern, and others of the plurality of first line pad terminals comprise second pad terminals arranged with a second pattern that is different from the first pattern.

9. The display device of claim 8, wherein some of the plurality of first line pad terminals are disposed between others of the plurality of first line pad terminals.

10. The display device of claim 3, further comprising a printed circuit board including a base film and a second pad portion that is coupled with the first pad portion,
    wherein the second pad portion comprises a plurality of second line pad terminals arranged along the first curved line, wherein the plurality of second line pad terminals are overlapped with the plurality of first line pad terminals.

11. The display device of claim 10, wherein at least one of the plurality of second line pad terminals includes a fourth pad terminal, and the fourth pad terminal comprises a pair of fourth sub-pad terminals, the pair of fourth sub-pad terminals being separated from each other.

12. The display device of claim 11, wherein the pair of fourth sub-pad terminals is arranged in a line.

13. The display device of claim 10, wherein the printed circuit board further comprises a driving chip disposed at a second side of the base film.

14. A display device comprising:
    a display substrate comprising a display area where an image is displayed and a pad area disposed at a periphery of the display area; and
    a first pad portion disposed in the pad area, the first pad portion comprising a plurality of first line pad terminals arranged along a first curved line in a first direction,
    wherein the plurality of first line pad terminals includes a second pad terminal, and the second pad terminal comprises:
    a pair of second sub-pad terminals that are spaced apart from each other; and
    a second terminal connection line connecting the pair of second sub-pad terminals to each other, wherein the second terminal connection line is straight.

15. The display device of claim 7, wherein the pair of second sub-pad terminals is arranged in a line.

16. The display device of claim 15, wherein the pair of second sub-pad terminals is arranged in a second direction that is substantially perpendicular to the first direction.

17. The display device of claim 14, wherein the pair of second sub-pad terminals has a third inclination angle with respect to the first direction.

18. The display device of claim 17, wherein the third inclination angle is between 0 degrees and 90 degrees.

19. A display device, comprising:
    a display substrate comprising a display area where an image is displayed and a pad area disposed at a periphery of the display area:
    a first pad portion disposed in the pad area, the first pad portion comprising a plurality of the first line pad terminals arranged along a first curved line in a first direction; and
    a printed circuit board including a base film and a second pad portion that is coupled with the first pad portion,
    wherein second pad or on comprises a plurality of second line pad terminals arranged along the first curved line, wherein the plurality of second line pad terminals are overlapped with the plurality of the first line pad terminals, wherein the plurality of second line pad terminals includes a third pad terminal, and the third pad terminal comprises:

a plurality of third row sub-pad terminals arranged in parallel with each other and arranged in a second direction, the second direction forming a first inclination angle with respect to the first direction; and a plurality of fourth row sub-pad terminals spaced apart from the plurality of third row sub-pad terminals, the plurality of fourth row sub-pad terminals arranged in parallel with each other and arranged in a third direction, the third direction forming a second inclination angle with respect to the first direction.

* * * * *